United States Patent
Chen et al.

(10) Patent No.: US 10,505,032 B2
(45) Date of Patent: Dec. 10, 2019

(54) SEMICONDUCTOR DEVICE WITH III-NITRIDE CHANNEL REGION AND SILICON CARBIDE DRIFT REGION

(71) Applicant: The Hong Kong University of Science and Technology, Kowloon, Hong Kong (CN)

(72) Inventors: Jing Chen, Hong Kong (CN); Jin Wei, Hong Kong (CN)

(73) Assignee: THE HONG KONG UNIVERSITY OF SCIENCE AND TECHNOLOGY, Kowloon (HK)

( * ) Notice: Subject to any disclaimer, the term of this patent is extended or adjusted under 35 U.S.C. 154(b) by 0 days.

(21) Appl. No.: 15/771,083

(22) PCT Filed: Oct. 28, 2016

(86) PCT No.: PCT/CN2016/103726
§ 371 (c)(1),
(2) Date: Apr. 25, 2018

(87) PCT Pub. No.: WO2017/071635
PCT Pub. Date: May 4, 2017

(65) Prior Publication Data
US 2018/0315844 A1    Nov. 1, 2018

Related U.S. Application Data

(60) Provisional application No. 62/285,484, filed on Oct. 30, 2015.

(51) Int. Cl.
*H01L 29/778* (2006.01)
*H01L 29/267* (2006.01)
(Continued)

(52) U.S. Cl.
CPC ...... *H01L 29/7788* (2013.01); *H01L 21/8258* (2013.01); *H01L 25/18* (2013.01);
(Continued)

(58) Field of Classification Search
CPC ........... H01L 29/66462; H01L 29/7787; H01L 29/66068; H01L 29/7788; H01L 29/205;
(Continued)

(56) References Cited

U.S. PATENT DOCUMENTS 7,719,055 B1   5/2010  McNutt et al.
7,723,751 B2   5/2010  Kawasaki et al.
(Continued)

FOREIGN PATENT DOCUMENTS

EP   1708275 A2   10/2006
EP   2 418 682 A2   2/2012

OTHER PUBLICATIONS

International Search Report for PCT Application No. PCT/CN2016/103726, dated Feb. 4, 2017, 4 pages.
(Continued)

*Primary Examiner* — Frederick B Hargrove
(74) *Attorney, Agent, or Firm* — Amin, Turocy & Watson, LLP

(57) ABSTRACT

Techniques are provided for forming a semiconductor device. In an aspect, a semiconductor device is provided that includes a silicon carbide (SiC) structure and a III-nitride structure. The SiC structure includes a drain electrode, a substrate layer that is formed on the drain electrode and includes SiC, and a drift layer formed on the substrate layer. The drift layer includes p-well regions that allow current to flow through a region between the p-well regions. The III-nitride structure includes a set of III-nitride semiconductor layers formed on the SiC structure, a passivation layer formed on the set of III-nitride semiconductor layers, a
(Continued)

source electrode electrically coupled to the p-well regions, and gate electrodes electrically isolated from the set of III-nitride semiconductor layers. In an aspect, the SiC structure includes a transition layer that includes connecting regions. In another aspect, the III-nitride structures includes connection electrodes electrically coupled to the connecting regions.

25 Claims, 29 Drawing Sheets

(51) Int. Cl.
| | |
|---|---|
| H01L 29/423 | (2006.01) |
| H01L 29/66 | (2006.01) |
| H01L 29/06 | (2006.01) |
| H01L 29/20 | (2006.01) |
| H01L 29/16 | (2006.01) |
| H01L 21/8258 | (2006.01) |
| H01L 27/06 | (2006.01) |
| H01L 27/085 | (2006.01) |
| H01L 25/18 | (2006.01) |
| H01L 29/10 | (2006.01) |
| H01L 29/207 | (2006.01) |
| H01L 29/808 | (2006.01) |

(52) U.S. Cl.
CPC ........ *H01L 27/0605* (2013.01); *H01L 27/085* (2013.01); *H01L 29/0646* (2013.01); *H01L 29/1608* (2013.01); *H01L 29/2003* (2013.01); *H01L 29/267* (2013.01); *H01L 29/4236* (2013.01); *H01L 29/66462* (2013.01); *H01L 29/7783* (2013.01); *H01L 29/7786* (2013.01); *H01L 29/0623* (2013.01); *H01L 29/1066* (2013.01); *H01L 29/207* (2013.01); *H01L 29/66068* (2013.01); *H01L 29/808* (2013.01)

(58) Field of Classification Search
CPC ............... H01L 29/7786; H01L 29/778; H01L 29/7789
See application file for complete search history.

(56) References Cited

U.S. PATENT DOCUMENTS

| | | | |
|---|---|---|---|
| 7,820,511 | B2 | 10/2010 | Sankin et al. |
| 8,017,981 | B2 | 9/2011 | Sankin et al. |
| 8,035,111 | B2 | 10/2011 | Sheppard |
| 8,558,285 | B2 | 10/2013 | Mishra et al. |
| 8,767,366 | B2 | 7/2014 | Ping et al. |
| 9,035,395 | B2 | 5/2015 | Matocha et al. |
| 9,184,243 | B2 | 11/2015 | Briere |
| 2006/0219997 | A1 | 10/2006 | Kawasaki et al. |
| 2008/0169474 | A1 | 7/2008 | Sheppard |
| 2010/0084687 | A1 | 4/2010 | Chen et al. |
| 2010/0148224 | A1 | 6/2010 | Zhao |
| 2011/0068371 | A1* | 3/2011 | Oka .................. H01L 29/66462 257/194 |
| 2012/0236449 | A1 | 9/2012 | Ping et al. |
| 2012/0241756 | A1 | 9/2012 | Zhang et al. |
| 2012/0256188 | A1 | 10/2012 | McDonald et al. |
| 2012/0256189 | A1 | 10/2012 | McDonald et al. |
| 2014/0042495 | A1 | 2/2014 | Parikh et al. |
| 2014/0299887 | A1 | 10/2014 | Matocha et al. |
| 2015/0028350 | A1* | 1/2015 | Suvorov ............. H01L 29/1608 257/77 |
| 2015/0115327 | A1* | 4/2015 | Briere ................... H01L 29/778 257/194 |
| 2015/0371982 | A1 | 12/2015 | Pan et al. |
| 2017/0040312 | A1* | 2/2017 | Curatola ............. H01L 27/0688 |

OTHER PUBLICATIONS

Marketsandmarkets.com, "Silicon Carbide Market Size, Growth, Trend and Forecast to 2022," http://www.marketsandmarkets.com/Market-Reports/silicon-carbide-electronics-market-439.html, Retrieved: Mar. 21, 2019, 17 pages.
Marketsandmarkets.com, "Gallium Nitride Semiconductor Device Market worth 22.47 Billion USD by 2023," http://www.marketsandmarkets.com/PressReleases/gallium-nitride-semiconductor.asp, Retrieved: Mar. 21, 2019, 3 pages.
Uemoto et al., "A normally-off AlGaN/GaN transistor with RonA= 2.6 mcm2 and BVds=640 V using conductivity modulation", in IEDM Tech. Dig., San Francisco, CA, USA, Dec. 2006, pp. 1-4.
Li et al., "Design and Simulation of 5-20-kV GaNEnhancement-Mode Vertical SuperjunctionHEMT", IEEE Electron Devices Society, vol. 60, No. 10, Oct. 20, 2013, pp. 3230-3237.
Wei et al., "Proposal of a GaN/SiChybrid field-effect transistor for power switching applications", IEEE Trans. Electron Devices, vol. 63, No. 6, Jun. 2016, pp. 2469-3473.
Wei et al., "Proposal of a novel GaN/SiChybrid FET (HyFET) with enhanced performance for high-voltage switching applications", in Proc. ISPSD, Prague, Czech, Jun. 2016, pp. 99-102.
Malhan et al., "Normally-off trench JFET technology in 4H silicon carbide" Microelectronic Engineering vol. 83, Issue 1, Jan. 2006, pp. 107-111.
K.J. Chen, et al., "Physics of Fluorine Plasma Ion Implantation for GaN Normally-off HEMT Technology" IEDM, 2011. 4 pages.
Wei, et al., "Enhancement-Mode GaN Double-Channel MOS-HEMT with Low On-Resistance and Robust Gate Recess" IEDM Tech. Dig., 2015. 4 pages.
Chung et al., "Improved inversion channel mobility for 4H-SiC MOSFETs following high temperature anneals in nitric oxide", IEEE Electron Device Lett., vol. 22, No. 4, Apr. 2001., pp. 176-178.
Modic et al., "High channel mobility 4H-SiC MOSFETs by antimony counter-doping", IEEE Electron Device Lett., vol. 35, No. 9, Sep. 2014, pp. 894-896.
Vetury et al., "The impact of surface states on the DC and RF characteristics of AlGaN/GaN HFETs", IEEE Trans. Electron Devices, vol. 48, No. 3, Mar. 2001, pp. 560-566.
Estrada et al., "n-AlGaAs/p-GaAs/n-GaN heterojunction bipolar transistor wafer-fused at 550-750° C.", Appl. Phys. Lett, vol. 83, No. 3, Jul. 2003, pp. 560-562.
Chen et al., "Study of a novel Si/SiC hetero-junction MOSFET", Solid-State Electronics, vol. 51, Mar. 2007, pp. 662-666.
Huang et al., "Analytical Loss Model of High Voltage GaN HEMT in Cascode Configuration", IEEE Trans. Power Electron., vol. 29, No. 5, May 2014, pp. 2208-2219.
Zhao et al., "Fabrication and characterization of 11-kV normally off 4H-SiC trenched-and-implanted vertical junction FET", IEEE Electron Device Lett., vol. 25, No. 7, Jul. 2004, pp. 474-476.
Pankove et al., "High-temperature GaN/SiC heterojunction bipolar transistor with high gain", in IEDM, San Francisco, CA, USA, 1994, pp. 389-392.
Cheng et al., "Static performance of 20 A, 1200 V 4H-SiC power MOSFETs at temperatures of −187 ° C. to 300 ° C.", J. Electron. Mater., vol. 41, No. 5, May 2012, pp. 910-914.
Joh et al., "Mechanisms for electrical degradation of GaN high-electron mobility transistors", in IEDM Tech. Dig., San Francisco, CA, USA, Dec. 2006, pp. 415-418.
Nie et al., "1.5-kV and 2.2-m-cm2 vertical GaN transistors on bulk-GaN substrates", IEEE Electron Device Lett., vol. 35, No. 9, Sep. 2014, pp. 939-941.
Oka et al., "Vertical GaN-based trench metal oxide semiconductor field-effect transistors on a free-standing GaN substrate with blocking voltage of 1.6 kV", Appl. Phys. Exp., vol. 7, No. 2, Jan. 2014, 4 pages.
Mihaila et al., "High temperature characterization of 4H-SiC normally-on vertical JFETs with buried gate and buried field rings", in Proc. ISPSD, Naples, Italy, Jun. 2006, pp. 1-4.
Wang et al., "Enhancement-mode Si3N4/AlGaN/GaN MISHFETs", IEEE Electron Device Lett., vol. 27, No. 10, Oct. 2006, pp. 793-795.
Semiconductor Today, Headline News, Jun. 14, 2016 http://www.semiconductor-today.com/news_items/2016/jun/hkust_140616.shtml.

(56) References Cited

OTHER PUBLICATIONS

Huang et al., "Enhancement-mode GaN hybrid MOS-HEMTS with Ron,sp of 20 mΩ-cm2", in Proc. ISPSD, Orlando, FL, USA, May 2008, pp. 295-298.
Wei et al., "Low on-resistance normally-off GaN double-channel metal—oxide—semiconductor high-electron-mobility transistor", IEEE Electron Device Lett., vol. 36, No. 12, Dec. 2015, pp. 1287-1290.
Torvik et al., "GaN/SiC heterojunction bipolar transistors", Solid-State Electronics, vol. 44, No. 7, Jul. 2000, pp. 1229-1233.
Srikanta et al., "Fabrication and characterization of a GaN/(4H)SiC vertical pn power diode using direct and interfaced epitaxial-growth approaches", Journal of Semiconductors, vol. 34, No. 4, Apr. 2013, 5 pages.
Torvik et al., "Electrical characterization of GaN/SiC n—p heterojunction diodes", Appl. Phys. Lett., vol. 72, No. 11, Mar. 16, 1998, pp. 1371-1373.

\* cited by examiner

200

| 108 |

300

| 110 |
| 108 |

FROM FIG. 3

FROM FIG. 7

FROM FIG. 9

SEMICONDUCTOR DEVICE WITH III-NITRIDE CHANNEL REGION AND SILICON CARBIDE DRIFT REGION

RELATED APPLICATION

This application is a U.S. National Stage filling under 35 U.S.C. § 371 of international patent cooperation treaty (PCT) application No. PCT/CN2016/103726, filed Oct. 28, 2016, and entitled "SEMICONDUCTOR DEVICE WITH III-NITRIDE CHANNEL REGION AND SILICON CARBIDE DRIFT REGION," which application claim priority to U.S. Provisional Patent Application No. 62/285,484, filed on Oct. 30, 2015, and entitled "Hybrid FET with III-nitride channel region and SiC drift region, and fabrication method thereof." The entireties of the aforementioned applications are hereby incorporated by reference herein.

TECHNICAL FIELD

This disclosure relates generally to a semiconductor device.

BACKGROUND

A silicon carbide metal oxide semiconductor field effect transistor (MOSFET) can be employed as a power semiconductor switching device. Normally-off operation can be obtained with SiC MOSFET technology. However, MOS-channel mobility of a silicon carbide MOSFET remains low after decades of technological advancements with respect to a MOSFET. Moreover, low MOS-channel mobility of a silicon carbide MOSFET can lead to undesired channel resistance. A junction gate field-effect transistor (JFET) can also be employed as a power semiconductor switching device. However, normally-off operation is difficult to achieve for a JFET. Furthermore, gate-to-drain capacitance of a JFET is generally large compared to other semiconductor devices, adversely impacting switching speed. SiC MOSFET and JFET devices are also generally vertical devices, with current flowing from a top portion of a semiconductor wafer to a backside portion of the semiconductor wafer where a drain electrode is generally formed. Vertical power devices are generally associated with increased vertical thickness rather than an increase in a lateral size (e.g., a device area) of the vertical power devices.

Additionally, a gallium nitride (GaN) based high electron mobility transistor (HEMT) can be employed as a power semiconductor switching device. A GaN HEMT is generally a lateral device with a high-mobility channel. However, in high-voltage power switching operation, high E-field can induce numerous reliability issues and/or stability issues such as current collapse (or dynamic on-resistance degradation) induced by surface and bulk traps, gate leakage, gate dielectric reliability degradation, etc. Scaling up the breakdown voltage in lateral devices can be achieved by increasing distance between a gate electrode and a drain terminal, which are generally both located on top of a semiconductor wafer. As a result, a larger device area is generally required for lateral devices.

The above-described background relating to conventional semiconductor devices is merely intended to provide a contextual overview of some current issues, and is not intended to be exhaustive. Other contextual information may become further apparent upon review of the following detailed description.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

Figure 1:
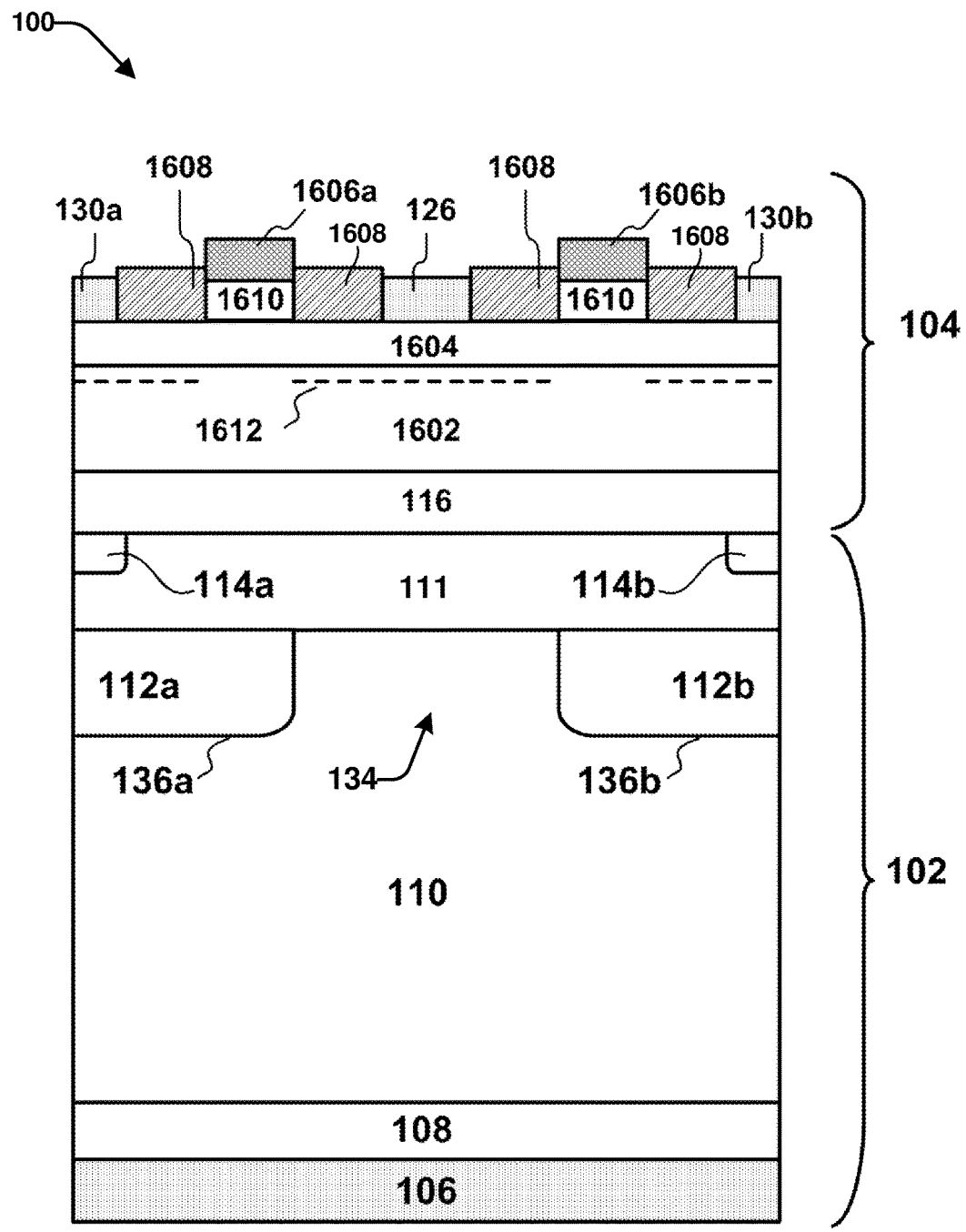
FIG. 1 presents a cross-sectional view of an example semiconductor device, in accordance with one or more embodiments described herein.

Various aspects or features of this disclosure are described with reference to the drawings, wherein like reference numerals are used to refer to like elements throughout. In this specification, numerous specific details are set forth in order to provide a thorough understanding of the subject disclosure. It should be understood, however, that the certain aspects of this disclosure may be practiced without these specific details, or with other methods, components, materials, etc. In other instances, well-known structures and devices are shown in block diagram form to facilitate describing the subject disclosure.

Various embodiments disclosed herein provide a structure and/or a fabrication method (e g, manufacturing method) for an improved semiconductor device that includes a III-N semiconductor (e.g., gallium nitride (GaN), aluminum nitride (AlN), indium nitride (InN), etc.) and a silicon carbide (SiC) semiconductor. The improved semiconductor device can include a III-nitride channel region and a SiC drift region. For instance, the improved semiconductor device can employ a GaN structure as a gate-controlled channel for the semiconductor device. Furthermore, a SiC structure can be employed as a drift region to, for example, sustain high off-state voltage for the semiconductor device. In one example, the improved semiconductor device can be a GaN/SiC hybrid field-effect transistor (FET). In a non-limiting example, the improved semiconductor device can include an AlGaN/GaN heterostructure and/or an E-mode AlGaN/GaN high electron mobility transistor (HEMT). The SiC structure can be, for example, a SiC n-type drift region. Thickness and/or doping concentration of the SiC drift region can be varied based on a desired voltage rating for the semiconductor device. In another non-limiting example, a semiconductor structure can include an AlN layer as a nucleation layer, a GaN layer as a buffer and channel layer, and an AlGaN as a barrier layer.

In an aspect, the SiC structure can include p-wells that are electrically coupled to a source electrode of the GaN structure. Furthermore, a pn junction can be located between the p-wells and an n-drift region of the SiC structure to, for example, sustain an off-state voltage associated with the semiconductor device. In an embodiment, an additional SiC layer can be formed above the p-wells. A doping concentration of the additional SiC layer can be different than a doping concentration of the drift region. An n+ region can be formed in the additional SiC layer to facilitate one or more connections (e.g., electrical connections) to one or more electrodes on the GaN structure. The GaN structure (e.g., an epitaxial GaN heterostructure) can be grown on the SiC structure. Alternatively another epitaxial III-nitride heterostructure such an MN heterostructure or an InN heterostructure can be grown on the SiC structure. In another aspect, a source electrode, a set of gate electrodes and/or a set of connection electrodes can be formed on the GaN structure. A drain electrode can be formed on a surface of the SiC structure. The source electrode can be electrically coupled to the p-wells. The set of gate electrodes can be electrically isolated from one or more layers of the GaN structure and/or one or more layers of the SiC structure. The set of connection electrodes can be electrically coupled to the n+ region in the SiC structure. A channel under the set of gate electrodes can be associated with a depletion-mode or an enhancement-mode. For an enhancement-mode channel, the set of gate electrodes can be formed such that a channel under the set of gate electrodes is depleted when a gate-to-source voltage is equal to zero. In an embodiment, an enhancement-mode channel can be formed by inserting a p-type GaN layer or a p-type AlGaN layer between the set of gate electrodes and an AlGaN/GaN heterojunction, by performing fluorine ion implantation, and/or by forming a recessed region under the set of gate electrodes.

As such, the improved semiconductor device disclosed herein can provide improved channel resistance (e.g., lower on-state resistance), improved voltage blocking capabilities (e.g., high-voltage blocking capabilities for a high-voltage power switch), improved working temperature (e.g., high temperature working capability), and/or improved switching speed (e.g., faster switching speed). The improved semiconductor device can also provide improved reliability (e.g., current collapse can be avoided, gate leakage can be reduced, channel resistance issues can be avoided and/or gate oxide reliability issues can be avoided), improved energy efficiency and/or reduced parasitic inductance. Moreover, the improved semiconductor device can be fabricated in a single chip and/or can be fabrication on a smaller chip area as compared to a conventional semiconductor device.

In an embodiment, a semiconductor device comprises a silicon carbide structure and a III-nitride structure. The silicon carbide structure comprises a drain electrode, a substrate layer, a drift layer and a set of connection regions. The substrate layer is formed on the drain electrode and comprises silicon carbide. In an aspect, the substrate layer can be made with silicon carbide with a surface of the substrate layer (e.g., a bottom side of the substrate layer) in electrical contact with the drain electrode. The drift layer is formed on the substrate layer. Furthermore, the drift layer comprises a first p-well region and a second p-well region that allow current to flow through a region between the first p-well region and the second p-well region. The set of connection regions comprises a higher doping concentration than the drift layer and a same type of doping as the drift layer. The III-nitride structure comprises a set of III-nitride semiconductor layers, a passivation layer, a source electrode, a connection electrode and a set of gate electrodes. The set of III-nitride semiconductor layers comprises III-nitride and is formed on the silicon carbide structure. The passivation layer is formed on the set of III-nitride semiconductor layers. The source electrode is electrically coupled to the first p-well region and the second p-well region. The connection electrode is electrically coupled to the set of connection regions. The set of gate electrodes is electrically isolated from the set of III-nitride semiconductor layers.

In another embodiment, a method provides for forming a drift layer comprising silicon carbide on a substrate layer, forming a first p-well region and a second p-well region in the drift layer, forming a transition layer on the drift layer, forming connecting regions in the transition layer, forming a set of III-nitride semiconductor layers comprising III-nitride on the transition layer, etching a portion of the set of III-nitride semiconductor layers to expose the first p-well region and the second p-well region, etching a portion of the set of III-nitride semiconductor layers to expose the connection regions, forming a passivation layer on the set of III-nitride semiconductor layers, and forming a set of electrodes on a barrier layer of the set of III-nitride semiconductor layers.

In yet another embodiment, a semiconductor device comprises a silicon carbide junction gate field-effect transistor (JFET) and a III-nitride high-electron-mobility transistor (HEMT). The silicon carbide JFET is configured as a voltage blocking portion of the semiconductor device. The III-nitride HEMT is configured as a current-control portion of the semiconductor device. A drain electrode of the III-nitride HEMT is electrically coupled or collected to a first source electrode of the silicon carbide JFET. Furthermore, a second source electrode of the III-nitride HEMT is electrically coupled or collected to a gate electrode of the silicon carbide JFET.

In yet another embodiment, power integrated circuit(s) can be formed on III-nitride structure(s) such as, for example, gallium nitride structure(s). Furthermore, a hybrid device can provide the capability to integrate functions on a same platform, such as, for example, gate driving circuits, power conversion circuits, wave generation circuits, etc.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

To the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Further, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

Conventional semiconductor devices have some drawbacks with respect to performance, efficiency, electrical property capabilities and/or thermal property capabilities, as mentioned above. On the other hand, various embodiments disclosed herein provide for an improved semiconductor device with improved performance, improved efficiency, improved electrical property capabilities, and improved thermal property capabilities. In this regard, and now referring to the drawings, FIG. 1 presents a cross-sectional view of an example semiconductor device 100 fabricated in accordance with one or more embodiments described herein. The semiconductor device 100 can be, for example, a semiconductor switch (e.g., a power switching device) with high voltage blocking capability, low resistance, fast switching speed, high temperature working capability, high efficiency, and high performance as compared to a conventional semiconductor device. The semiconductor device 100 can be employed in various applications such as, but not limited to, power converters (e.g., high-efficiency and high temperature power converters), automotive applications, industrial applications, aviation applications, power transmission applications, power supplies, solid-state lighting power supplies, high power switched power supplies, electronic devices, electronic chips, AC/DC converters (e.g., high-efficiency compact AC/DC converters), other technical applications, etc. In one example, the semiconductor device 100 can be a hybrid FET with a III-nitride channel region and a silicon carbide drift region.

The semiconductor device 100 can include a silicon carbide structure 102 and a III-nitride structure 104. The III-nitride structure 104 can be coupled to and/or formed on the silicon carbide structure 102. In one example, the III-nitride structure 104 can be grown on the silicon carbide structure 102. Furthermore, the III-nitride structure 104 can be a III-nitride semiconductor heterostructure channel (e.g., a III-nitride semiconductor heterostructure channel). In an embodiment, the III-nitride structure 104 can be a gallium nitride structure. In an alternate embodiment, the III-nitride structure 104 can be another type of III-N semiconductor structure such as, for example, an aluminum nitride structure or an indium nitride structure. The silicon carbide structure 102 can be a voltage blocking portion of the semiconductor device 100. Furthermore, functionality of the silicon carbide structure 102 can be similar to functionality of a JFET structure. The III-nitride structure 104 can be a current-control portion of the semiconductor device 100. As such, the silicon carbide structure 102 can correspond to silicon carbide JFET and the III-nitride structure 104 can correspond to a III-nitride HEMT (e.g., a gallium nitride HEMT). In an aspect, the silicon carbide structure 102 and the III-nitride structure 104 can be fabricated monolithically on a wafer.

The silicon carbide structure 102 can include a drain electrode 106, a substrate layer 108, a drift layer 110 and a transition layer 111. The drift layer 110 can include a first p-well region 112a and/or a second p-well region 112b. The transition layer 111 can include a first connecting region 114a (e.g., a first connection region) and/or a second connecting region 114b (e.g., a second connection region). The III-nitride structure 104 can include a nucleation layer 116, a channel layer 1602, a barrier layer 1604, a passivation layer 1608, and a p-type layer 1610. The channel layer 1602 and/or the barrier layer 1604 can be implemented as, for example, a set of III-nitride semiconductor layers. In an aspect, the III-nitride structure 104 can also include a source electrode 126, a first gate electrode 1606a, a second gate electrode 1606b, a first connection electrode 130a, and/or a second connection electrode 130b.

The substrate layer 108 can be formed on the drain electrode 106. The substrate layer 108 can comprise silicon carbide. In one example, the substrate layer 108 can be an n+ silicon carbide substrate. The drift layer 110 can be formed on the substrate layer 108. Furthermore, the drift layer 110 can comprise silicon carbide. In one example, the drift layer 110 can be an n-drift silicon carbide layer. In another example, the drift layer 110 can be grown in the substrate layer 108 via an epitaxial growth process. In an aspect, the substrate layer 108 and the drift layer 110 can comprise a corresponding type of doping. Additionally, the transition layer 111 can be formed on the drift layer 110. For example, the transition layer 111 can be located above the drift layer 110. In one example, the transition layer 111 can be a regrown layer of the drift layer 110. The transition layer 111 can be a silicon carbide layer with a doping type that corresponds to the drift layer 110. For instance, the transition layer 111 can include a same doping type as the drift layer 110.

The first p-well region 112a and the second p-well region 112b of the drift layer 110 can be formed via an ion implantation process. Alternatively, the first p-well region 112a and the second p-well region 112b of the drift layer 110 can be formed via a combination of a recessing process, a growth process, a planarization process, and/or a regrowth process. The first p-well region 112a and the second p-well region 112b of the drift layer 110 can allow current to flow through a region 134 between the first p-well region 112a and the second p-well region 112b. In a non-limiting example, a width of the region 134 can be equal to 3 µm and width of the drift layer 110 (e.g., a cell pitch of the drift layer 110) can be equal to 10 µm. The first p-well region 112a and the second p-well region 112b can be associated with a p-type semiconductor. In an aspect, the first p-well region 112a can form a first pn-junction 136a between the first p-well region 112a and the drift layer 110. Additionally, the second p-well region 112b can form a second pn-junction 136b between the second p-well region 112b and the drift layer 110. In an embodiment, after formation of the first p-well region 112a and the second p-well region 112b, a portion of the drift layer 110 can be formed above the first p-well region 112a and the second p-well region 112b. For example, a silicon carbide n-type layer of the drift layer 110 can be deposited by a regrowth process. In another aspect, the first connecting region 114a and/or the second connecting region 114b can be located above the first p-well region 112a and/or the second p-well region 112b (e.g., the first connecting region 114a and/or the second connecting region 114b can be located in the transition layer 111). Furthermore, the first connecting region 114a and/or the second connecting region 114b can be highly doped (e.g., as compared to, for example, the drift layer 110) to facilitate formation of one or more ohmic contacts. For instance, the first connecting region 114a can be a first N+ semiconductor region and/or the second connecting region 114b can be a second N+ semiconductor region. The first connecting region 114a and/or the second connecting region 114b can be formed on a surface of the transition layer 111 for connection purposes. Furthermore, the first connecting region 114a and/or the second connecting region 114b can be formed via an ion implantation process. Alternatively, the first connecting region 114a and/or the second connecting region 114b can be formed via a combination of a recessing process, a growth process, a planarization process, and/or a regrowth process.

The III-nitride structure 104 can be a gallium nitride hetero-structure (e.g., an AlGaN/GaN structure). The III-nitride structure 104 can be grown on the silicon carbide structure 102. In one example, the III-nitride structure 104 can be grown on the silicon carbide structure 102 via metal-organic chemical vapor deposition (MOCVD). In another example, the III-nitride structure 104 can be grown on the silicon carbide structure 102 via molecular beam epitaxy (MBE). However, it is to be appreciated that the III-nitride structure 104 can be grown on the silicon carbide structure 102 via another technique. Furthermore, it is to be appreciated that the III-nitride structure 104 can be a different type of III-nitride structure. For example, in an alternate embodiment an aluminum nitride structure or an indium nitride structure can be grown on the silicon carbide structure 102.

In an embodiment, the nucleation layer 116 can be formed on the silicon carbide structure 102. For example, the nucleation layer 116 can be formed on the transition layer 111. In an aspect, a portion of the nucleation layer 116 can be formed on the first connecting region 114a and/or the second connecting region 114b. The nucleation layer 116 can comprise aluminum nitride. The channel layer 1602 can be formed on the nucleation layer 116. The channel layer 1602 can comprise gallium nitride. In one example, the channel layer 1602 can be a buffer layer. In an embodiment, the channel layer 1602 can be associated with and/or can include the first channel layer 118a and the second channel layer 118b. Additionally, in an embodiment, the channel layer 1602 can be associated with and/or can include the insertion layer 120. Furthermore, the barrier layer 1604 can be formed on the channel layer 1602. The barrier layer 1604 can comprise gallium nitride. The passivation layer 1608 and the p-type layer 1610 can be formed on the barrier layer 1604. The passivation layer 1608 can be an insulator layer. Furthermore, the first gate electrode 1606a and the second gate electrode 1606b can be formed on the p-type layer 1610. As such, the p-type layer 1610 be formed between the barrier layer 1604 and a set of gate electrodes (e.g., the first gate electrode 1606a and the second gate electrode 1606b). The p-type layer 1610 can be employed to facilitate normally-off operation of the semiconductor device 100. In an aspect, the channel layer 1602 can include a 2-dimensional electron gas (2DEG) channel 1612. For example, when a drain voltage is applied to the drain electrode 106, electrons can flow from the source electrode 126 through the 2DEG channel 1612. In an embodiment, the p-type layer 1610 can be formed between the first gate electrode 1606a and/or the barrier layer 1604. Additionally or alternatively, the p-type layer 1610 can be formed between the second gate electrode 1606b and the barrier layer 1604. The p-type layer 1610 can comprise a p-type semiconductor associated with p-type doping. Furthermore, the p-type layer 1610 can be a p-cap layer that is patterned.

In an aspect, the first connecting region 114a can be electrically coupled to the first connection electrode 130a. Furthermore, the second connecting region 114b can be electrically coupled to the second connection electrode 130b. In one example, the III-nitride structure 104 and/or the silicon carbide structure 102 can be associated with a set of contact holes that allow the source electrode 126 to be electrically coupled to the first p-well region 112a and/or the second p-well region 112b. Furthermore, the III-nitride structure 104 can be associated with another set of contact holes that allow the first connection electrode 130a to be electrically coupled to the first connecting region 114a and/or the second connection electrode 130b to be electrically coupled to the second connecting region 114b.

In an embodiment, the semiconductor device 100 can be a three terminal device with a gate (e.g., the first gate electrode 1606a and/or the second gate electrode 1606b), a source (e.g., the source electrode 126), and a drain (e.g., the drain electrode 106). In another embodiment, the semiconductor device 100 can be a four terminal device with a gate (e.g., the first gate electrode 1606a and/or the second gate electrode 1606b), a source (e.g., the source electrode 126), a drain (e.g., the drain electrode 106), and a connecting electrode (e.g., the first connection electrode 130a, the second connection electrode 130b).

In an off-state of the semiconductor device 100 where a voltage associated with the first gate electrode 1606a and/or the second gate electrode 1606b (e.g., a gate voltage) is below a threshold voltage value, when a certain voltage is applied to the drain electrode 106 (e.g., a high drain voltage is applied), a particular voltage of the first connecting region 114a and/or the second connecting region 114b can be increased. Furthermore, in the off-state of the semiconductor device 100, when the certain voltage is applied to the drain electrode 106, the first pn-junction 136a and/or the second pn-junction 136b can be reversely biased. Furthermore, a depletion region of the first pn-junction 136a and/or the second pn-junction 136b can be widened. An aperture between the first p-well region 112a and the second p-well region 112b can also be pinched off. Additionally or alternatively, a region above the first p-well region 112a and the second p-well region 112b can be pinched off. Therefore, a particular voltage for the drain electrode 106 (e.g. a high drain voltage) can be sustained by the first pn-junction 136a and/or the second pn-j unction 136b. Moreover, voltage at the first connecting region 114a and/or the second connecting region 114b can be portion (e.g., a small portion) of the particular voltage for the drain electrode 106 (e.g., the drain voltage). Since the first connection electrode 130a can be electrically connected to the first connecting region 114a, voltage of the first connection electrode 130a can correspond to voltage of the first connecting region 114a. Similarly, since the second connection electrode 130b can be electrically connected to the second connecting region 114b, voltage of the second connection electrode 130b can correspond to voltage of the second connecting region 114b. Therefore, the III-nitride structure 104 can sustain a portion of the particular voltage for the drain electrode 106 (e.g., a small portion of the high drain voltage). As such, current collapse and/or gate leakage current can be suppressed in the semiconductor device 100.

In an on-state of the semiconductor device 100 where a voltage associated with the first gate electrode 1606a and/or the second gate electrode 1606b (e.g., a gate voltage) is above a threshold voltage value, when a certain voltage is applied to the drain electrode 106 (e.g., a high drain voltage is applied), electrons can flow from the source electrode 126, through the 2DEG channel, and to the first connection electrode 130a and/or the second connection electrode 130b. Electrons can also continue to flow from the first connecting region 114a and/or the second connecting region 114b, through aperture between the first p-well region 112a and the second p-well region 112b, through the drift layer 110, and to the drain electrode 106. Due to high 2DEG density in the III-nitride structure 104 and high electron mobility of the 2DEG channel, resistance of the silicon carbide structure 102 can be very small as compared to channel resistance of a conventional semiconductor device (e.g., a SiC MOSFET). Furthermore, a gate to drain capacitance can be very minimized in the semiconductor device 100, and switching speed of the semiconductor device 100 can be faster than a conventional semiconductor device (e.g., a SiC MOSFET).

Figure 2:
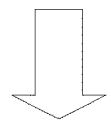
FIG. 2-11 present a cross-sectional view of example intermediate device structure(s) associated with a process for fabricating a semiconductor device, in accordance with one or more embodiments described herein.

FIGS. 2-11 pictorially depict an example process for fabricating the semiconductor device 100. Repetitive description of like elements employed in other embodiments described herein is omitted for sake of brevity. With reference to FIG. 2 presented is a cross-sectional view of an intermediate device structure 200 that includes the substrate layer 108. The substrate layer 108 can comprise silicon carbide. Alternatively, the substrate layer 108 can comprise a different type of material such as, but not limited to, silicon, sapphire, gallium nitride, another type of material, etc. The substrate layer 108 can be highly doped as compared to other layers of the semiconductor device 100. In one example, the substrate layer 108 can be an n+ silicon carbide substrate. In an embodiment, the substrate layer 108 can be formed on the drain electrode 106.

Figure 3:
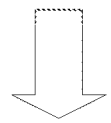

Referring now to FIG. 3, presented is a cross-sectional view of an intermediate device structure 300 that includes the substrate layer 108 and the drift layer 110. The intermediate device structure 300 can be a next structure formed after the intermediate device structure 200 (e.g., in the process for fabricating the semiconductor device 100). The drift layer 110 can be a silicon carbide drift layer. Furthermore, the drift layer 110 can be grown on the substrate layer 108. Thickness of the drift layer 110 can be determined based on an expected voltage blocking capacity of the semiconductor device 100. Additionally or alternatively, a doping concentration of the drift layer 110 can be determined based on an expected voltage blocking capacity of the semiconductor device 100.

Figure 4:
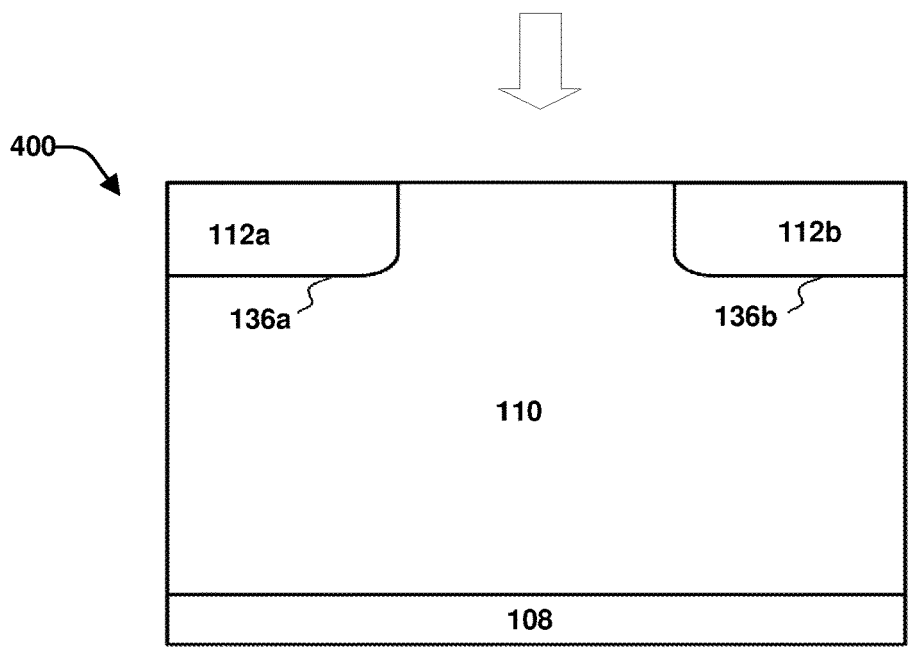

Referring to FIG. 4, presented is a cross-sectional view of an intermediate device structure 400 that includes the substrate layer 108 and the drift layer 110. The intermediate device structure 400 can be a next structure formed after the intermediate device structure 300 (e.g., in the process for fabricating the semiconductor device 100). As shown in FIG. 4, the first p-well region 112a and the second p-well region 112b can be formed in the drift layer 110. In one example, the first p-well region 112a and the second p-well region 112b can be formed in the drift layer 110 via implantation (e.g., ion implantation). In another example, the first p-well region 112a and the second p-well region 112b can be formed in the drift layer 110 via an epitaxial growth process. The first p-well region 112a can be associated with the first pn-junction 136a and the second p-well region 112b can be associated with the second pn-junction 136b.

Figure 5:
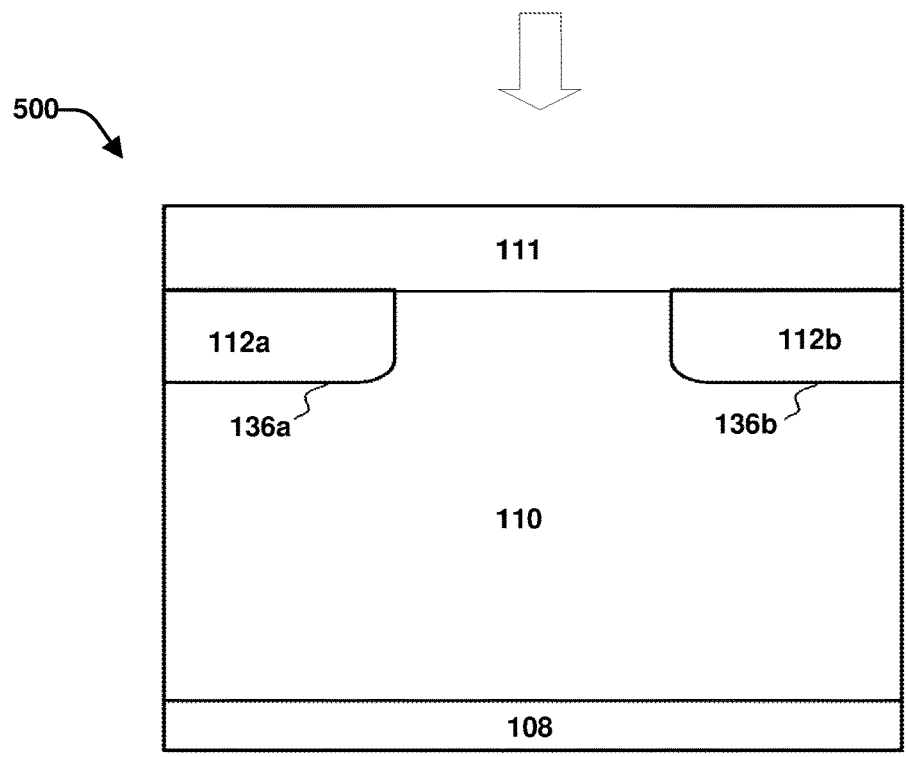

Referring to FIG. 5, presented is a cross-sectional view of an intermediate device structure 500 that includes the substrate layer 108 and the drift layer 110. The intermediate device structure 500 can be a next structure formed after the intermediate device structure 400 (e.g., in the process for fabricating the semiconductor device 100). As shown in FIG. 5, the transition layer 111 can be formed on the drift layer 110. For example, the transition layer 111 can be located above the drift layer 110. In one example, transition layer 111 can be a regrown layer of the drift layer 110. The transition layer 111 can be a silicon carbide layer with a doping type that corresponds to the drift layer 110. For instance, the transition layer 111 can include a same doping type as the drift layer 110. As such, a doping concentration of the transition layer 111 can correspond to a doping concentration of the drift layer 110. In an alternate embodiment, a doping concentration of the transition layer 111 can be different than a doping concentration of the drift layer 110. In an embodiment, a shield region can be located in the transition layer 111. The shield region of the transition layer 111 can include a same doping type as the first p-well region 112a and the second p-well region 112b. Furthermore, the shield region of the transition layer 111 can be electrically coupled to the source electrode 126.

Figure 6:
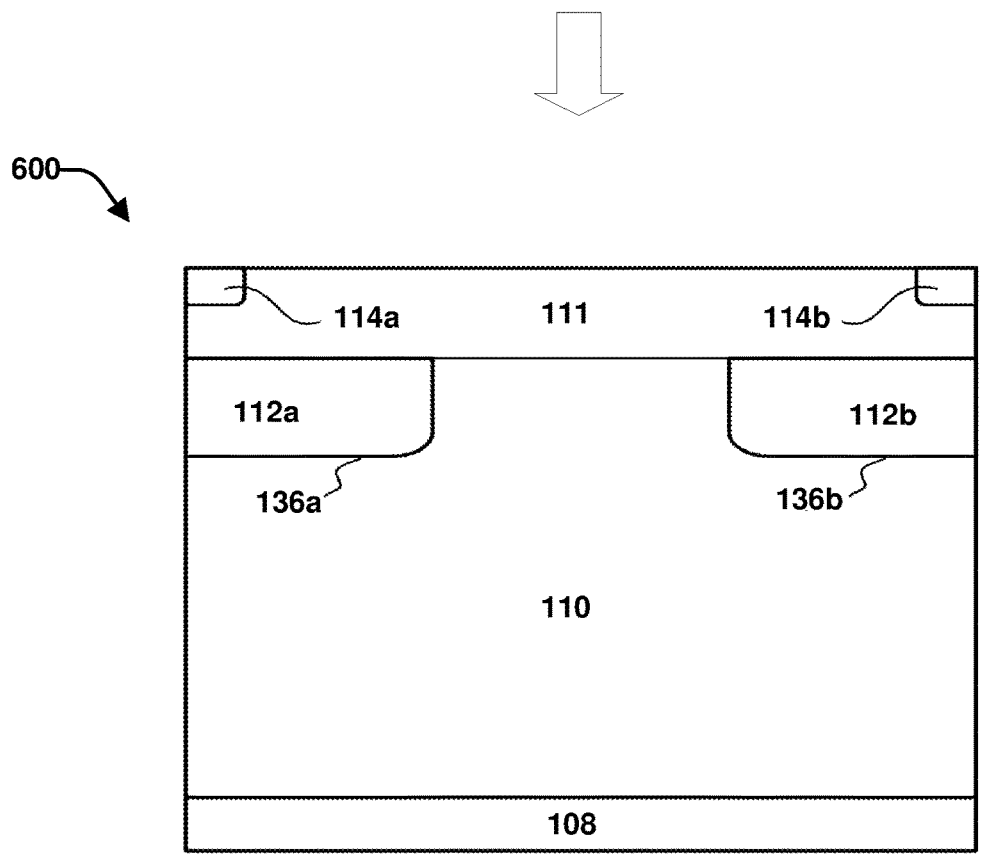

Referring to FIG. 6, presented is a cross-sectional view of an intermediate device structure 600 that includes the substrate layer 108 and the drift layer 110. The intermediate device structure 600 can be a next structure formed after the intermediate device structure 500 (e.g., in the process for fabricating the semiconductor device 100). As shown in FIG. 6, the first connecting region 114a and the second connecting region 114b can be formed in the drift layer 110. For example, the first connecting region 114a and the second connecting region 114b can be formed in the transition layer 111 of the drift layer 110. The first connecting region 114a and the second connecting region 114b can be highly doped as compared to at least the drift layer 110. In one example, the first connecting region 114a and the second connecting region 114b can be formed in the transition layer 111 via implantation (e.g., ion implantation). In another example, the first connecting region 114a and the second connecting region 114b can be formed in the transition layer 111 via an epitaxial growth process.

Figure 7:
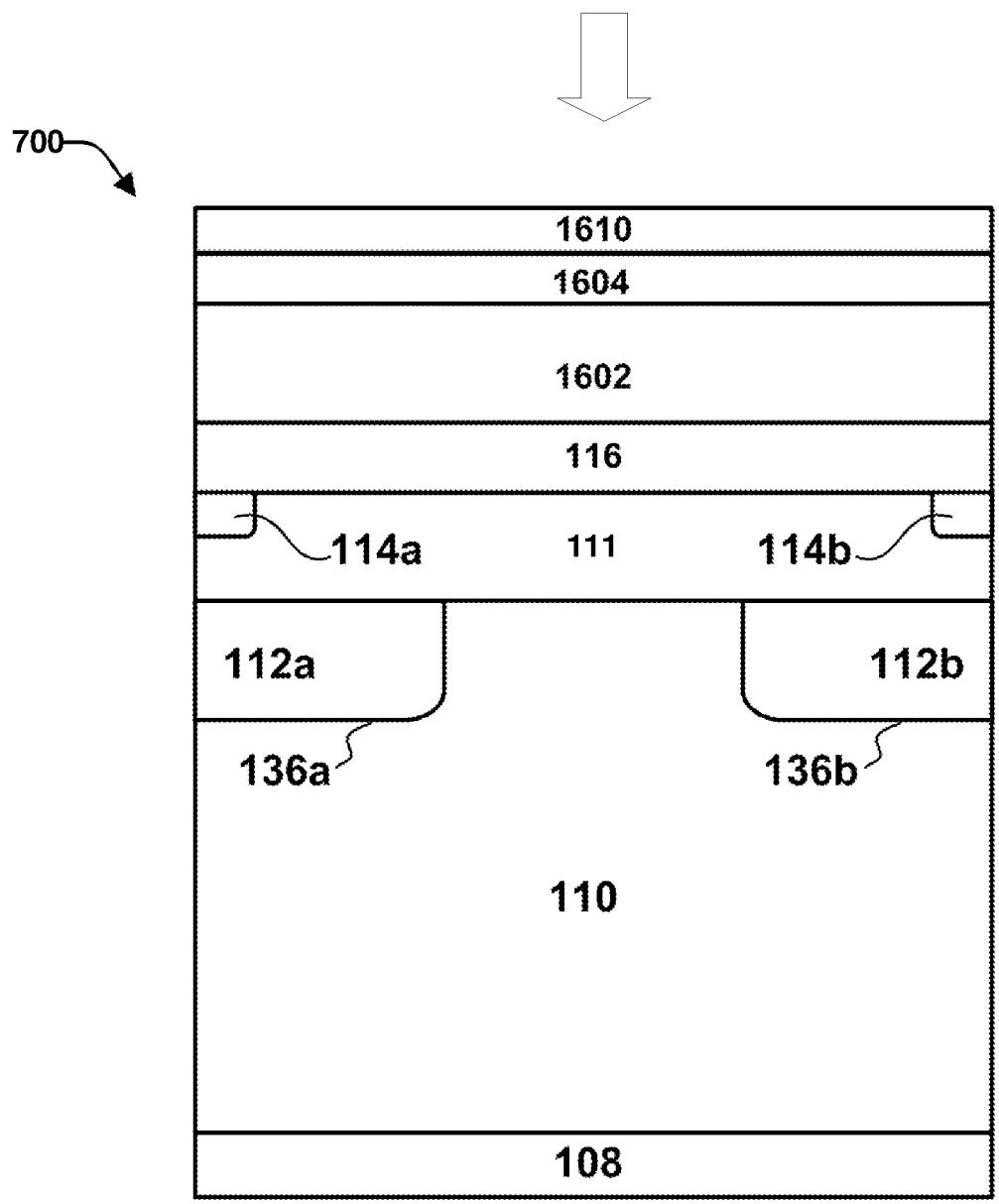

Referring to FIG. 7, presented is a cross-sectional view of an intermediate device structure 700 that includes the substrate layer 108, the drift layer 110, the transition layer 111, the nucleation layer 116, the channel layer 1602, the barrier layer 1604 and the p-type layer 1610. The intermediate device structure 700 can be a next structure formed after the intermediate device structure 600 (e.g., in the process for fabricating the semiconductor device 100).

A set of III-V semiconductor layers (e.g., a set of gallium nitride semiconductor layers, etc.) that includes the nucleation layer 116, the channel layer 1602 and/or the barrier layer 1604 can be formed on the transition layer 111. In an aspect, the nucleation layer 116 can be formed on (e.g., grown on top of) the transition layer 111. In one example, the nucleation layer 116 can comprise gallium nitride (e.g., low temperature gallium nitride). In another example, the nucleation layer 116 can comprise aluminum nitride. In yet another example, the nucleation layer 116 can comprise indium nitride. Additionally or alternatively, the channel layer 1602 can be formed on the nucleation layer 116. In one example, the channel layer 1602 can comprise gallium nitride. In another example, the channel layer 1602 can comprise aluminum nitride. In yet another example, the channel layer 1602 can comprise indium nitride. In yet another example, the channel layer 1602 can comprise indium gallium nitride. In yet another example, the channel layer 1602 can comprise aluminum gallium nitride. Additionally or alternatively, the barrier layer 1604 can be formed on the channel layer 1602. In one example, the barrier layer 1604 can comprise gallium nitride. In another example, the barrier layer 1604 can comprise aluminum nitride. In yet another example, the barrier layer 1604 can comprise indium nitride. In yet another example, the barrier layer 1604 can comprise aluminum gallium nitride. In yet another example, the barrier layer 1604 can comprise aluminum indium nitride. Additionally or alternatively, the p-type layer 1610 can be formed on the barrier layer 1604.

Figure 8:
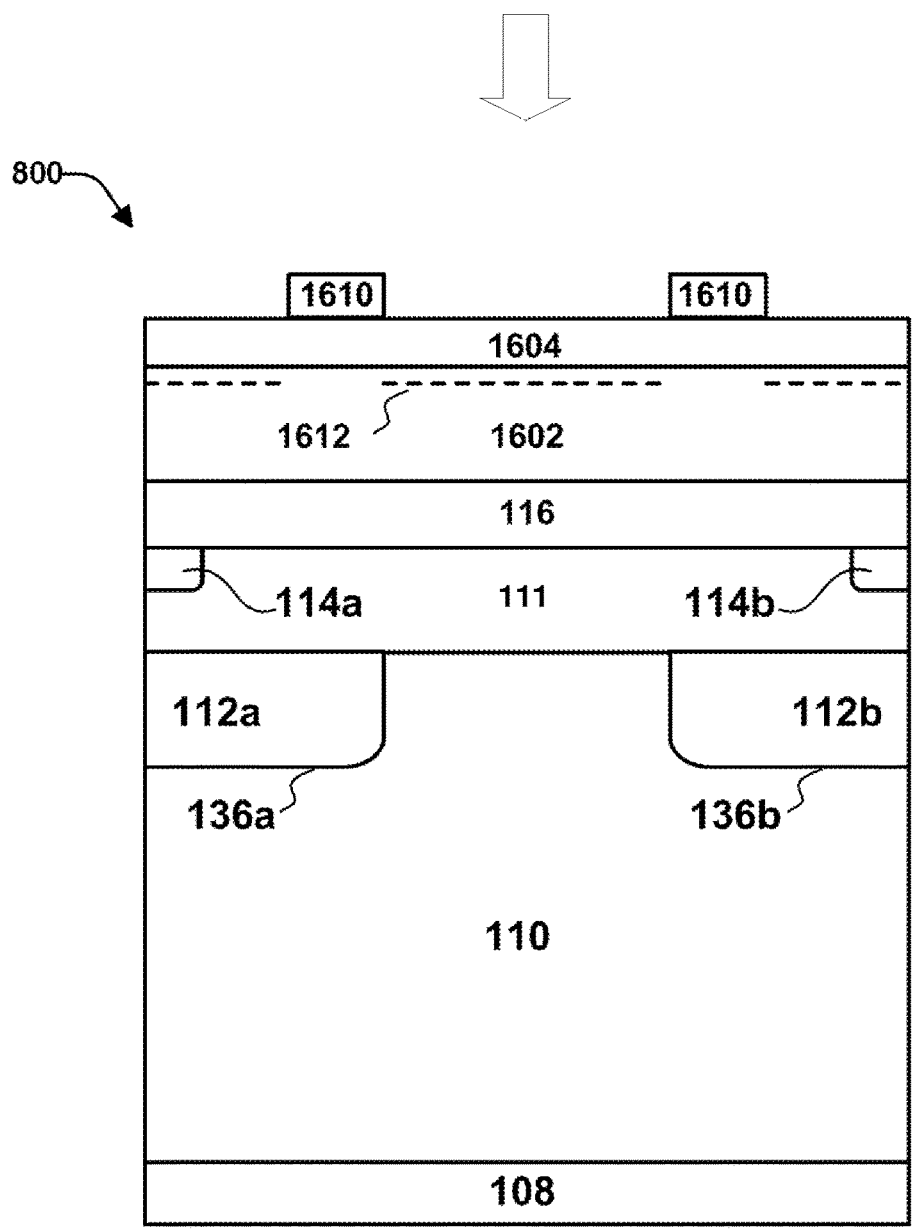

Referring to FIG. 8, presented is a cross-sectional view of an intermediate device structure 800 that includes the substrate layer 108, the drift layer 110, the transition layer 111, the nucleation layer 116, the channel layer 1602, the barrier layer 1604 and the p-type layer 1610. The intermediate device structure 800 can be a next structure formed after the intermediate device structure 700 (e.g., in the process for fabricating the semiconductor device 100). As shown in FIG. 8, a portion of the p-type layer 1610 can be etched. The portion of the p-type layer 1610 can be etched, for example, via a wet etching process, a dry etching process, inductively coupled plasma (ICP) etching, etc.

Figure 9:
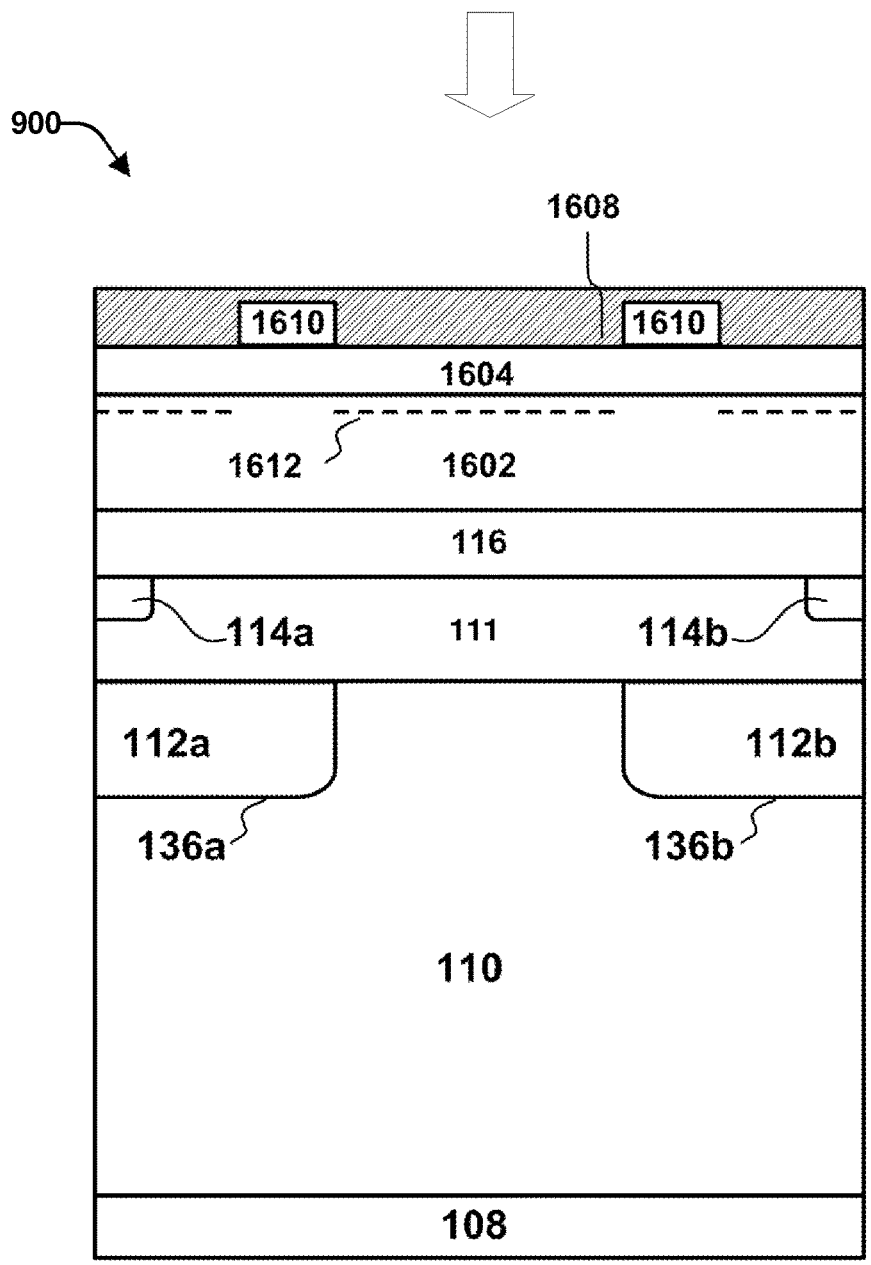

Referring to FIG. 9, presented is a cross-sectional view of an intermediate device structure 900 that includes the substrate layer 108, the drift layer 110, the transition layer 111, the nucleation layer 116, the channel layer 1602, the barrier layer 1604, the passivation layer 1608 and the p-type layer 1610. The intermediate device structure 900 can be a next structure formed after the intermediate device structure 800 (e.g., in the process for fabricating the semiconductor device 100). The passivation layer 1608 can be formed on the barrier layer 1604 and the p-type layer 1610. For example, the passivation layer 1608 can cover the barrier layer 1604 and the p-type layer 1610. In one example, the passivation layer 1608 can comprise nitride. In another example, the passivation layer 1608 can comprise aluminum gallium nitride layer. In yet another example, the passivation layer 1608 can comprise an oxide (e.g., a silicon dioxide). In yet another example, the passivation layer 1608 can be a polymer layer. In yet another example, the passivation layer 1608 can be a polyimide layer.

Figure 10:
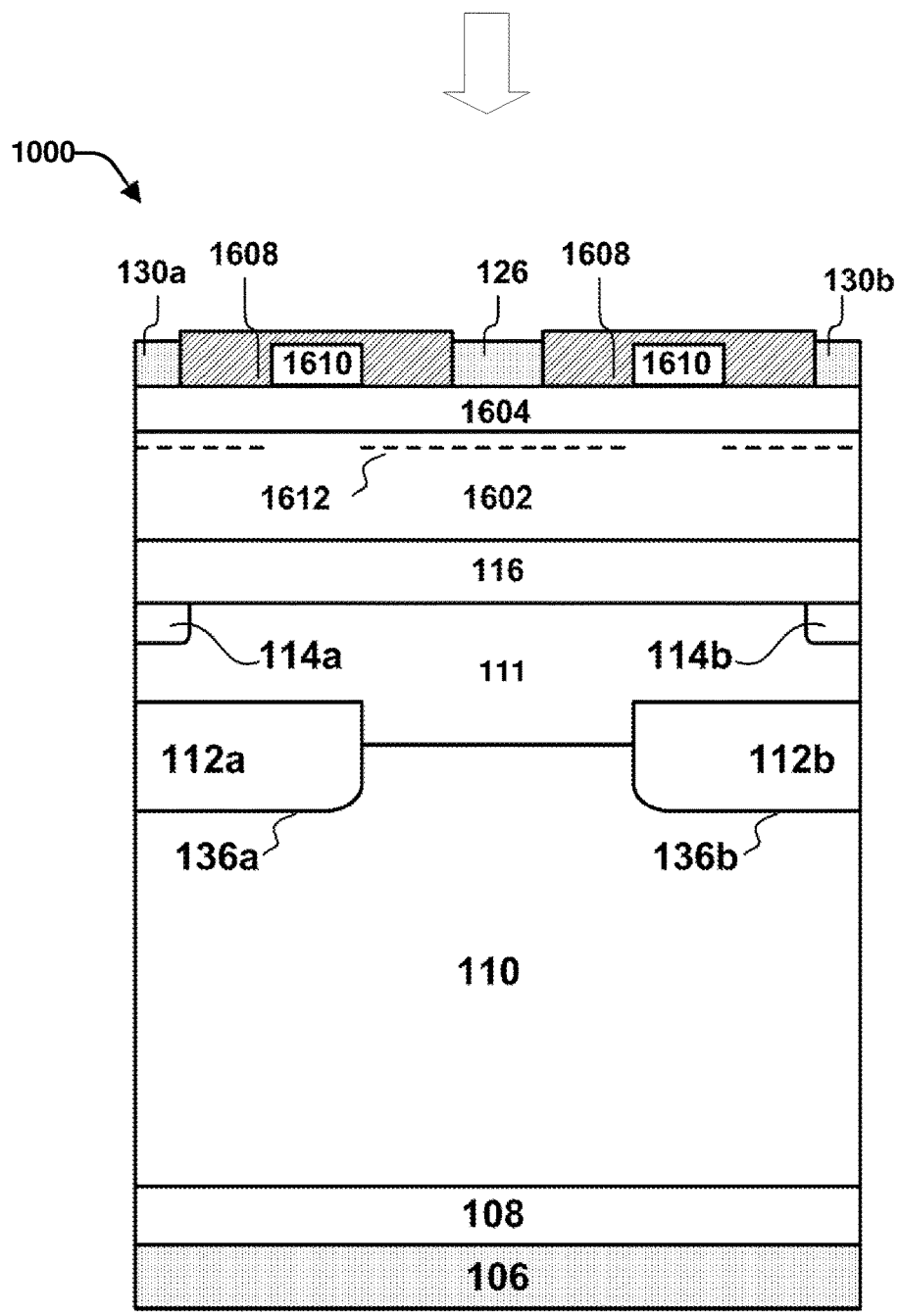

Referring to FIG. 10, presented is a cross-sectional view of an intermediate device structure 1000 that includes the drain electrode 106, the substrate layer 108, the drift layer 110, the transition layer 111, the nucleation layer 116, the channel layer 1602, the barrier layer 1604, the passivation layer 1608, the p-type layer 1610, the drain electrode 106, the source electrode 126, the first connection electrode 130a and the second connection electrode 130b. The intermediate device structure 1000 can be a next structure formed after the intermediate device structure 900 (e.g., in the process for fabricating the semiconductor device 100).

As shown in FIG. 10, a surface of the substrate layer 108 (e.g., a bottom side of the substrate layer 108) can be attached to the drain electrode 106. Furthermore, a first portion of the passivation layer 1608 can be etched to facilitate formation of the first connection electrode 130a on the barrier layer 1604, a second portion of the passivation layer 1608 can be etched to facilitate formation of the source electrode 126 on the barrier layer 1604, and a third portion of the passivation layer 1608 can be etched to facilitate formation of the second connection electrode 130b on the barrier layer 1604. The first portion, the second portion and/or the third portion of the passivation layer 1608 can be etched, for example, via a wet etching process, a dry etching process, ICP etching, etc.

Figure 11:
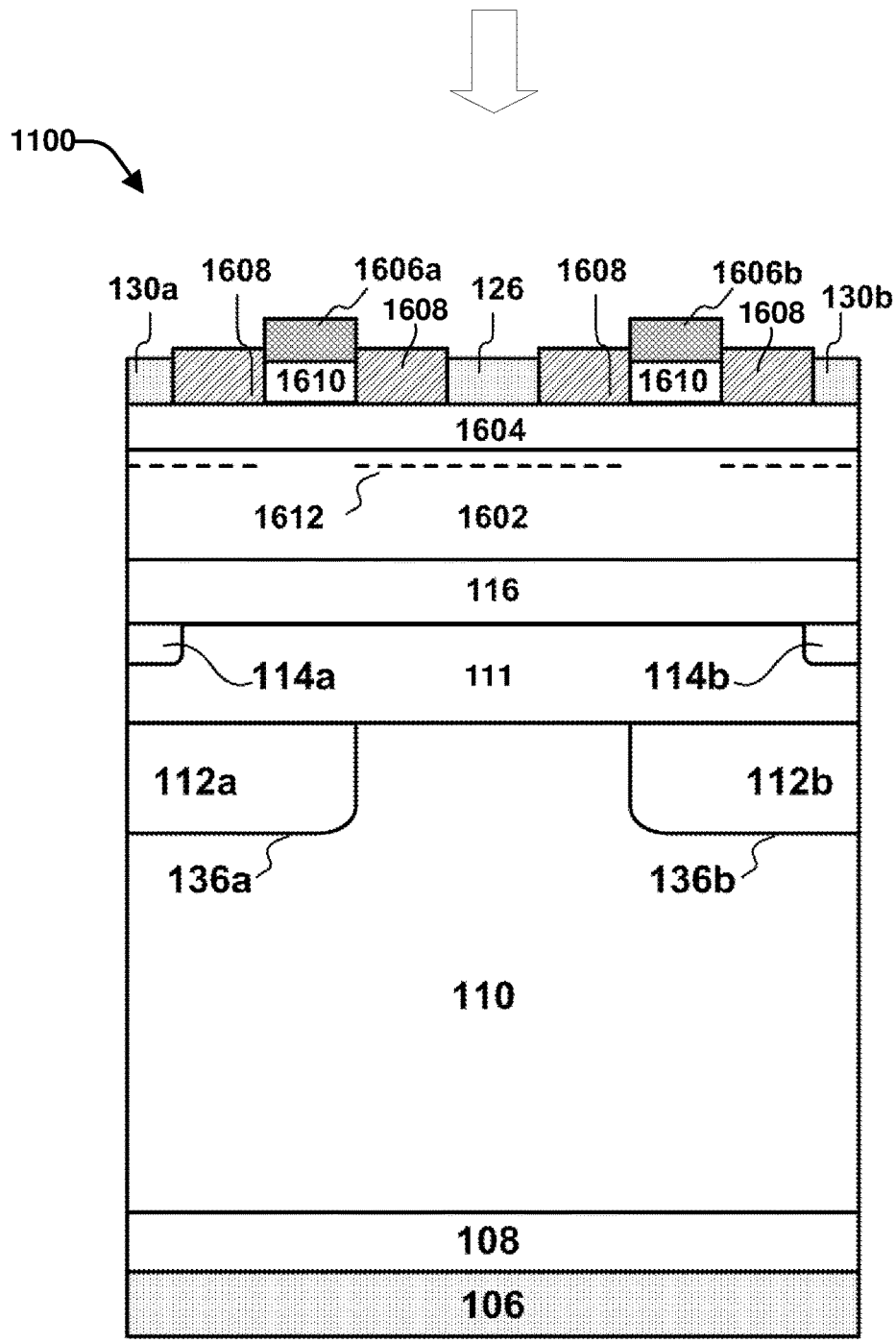

Referring to FIG. 11, presented is a cross-sectional view of a device structure 1100 that includes the drain electrode 106, the substrate layer 108, the drift layer 110, the transition layer 111, the nucleation layer 116, the channel layer 1602, the barrier layer 1604, the passivation layer 1608, the p-type layer 1610, the drain electrode 106, the source electrode 126, the first gate electrode 1606a, the second gate electrode 1606b, the first connection electrode 130a and the second connection electrode 130b. The device structure 1100 can be a next structure formed after the intermediate device structure 1000. Furthermore, the device structure 1100 can correspond to the semiconductor device 100.

As shown in FIG. 11, the first gate electrode 1606a and the second gate electrode 1606b can be formed on the p-type layer 1610. For example, a fourth portion of the passivation layer 1608 can be etched to facilitate formation of the first gate electrode 1606a on the p-type layer 1610. Furthermore, a fifth portion of the passivation layer 1608 can be etched to facilitate formation of the second gate electrode 1606b on the p-type layer 1610. The fourth portion and/or the fifth portion of the passivation layer 1608 can be etched, for example, via a wet etching process, a dry etching process, ICP etching, etc.

Figure 12:
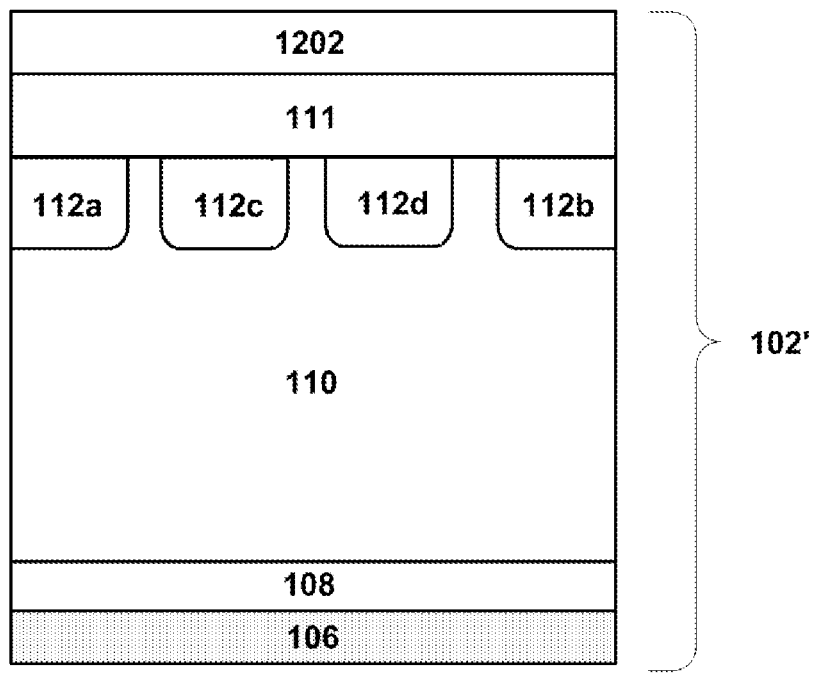
FIG. 12 presents a cross-sectional view of an example silicon carbide structure, in accordance with one or more embodiments described herein.

Referring now to FIG. 12, presented is a cross-sectional view of a silicon carbide structure 102'. The silicon carbide structure 102' can be an alternate embodiment of the silicon carbide structure 102. The silicon carbide structure 102' can include the drain electrode 106, the substrate layer 108, the drift layer 110, the transition layer 111, and a connecting region 1202. The drift layer 110 can include the first p-well region 112*a*, the second p-well region 112*b*, a third p-well region 112*c*, a fourth p-well region 112*d* The connecting region can be formed on the transition layer 111. With the silicon carbide structure 102', the connecting region 1202 can be employed instead of the first connecting region 114*a* and the second connecting region 114*b*. For example, the connecting region 1202 of the silicon carbide structure 102' can be a continuous layer formed on the transition layer 111. As such, complexity of a fabrication process and/or a number of masking operations during a fabrication process can be reduced.

Figure 13:
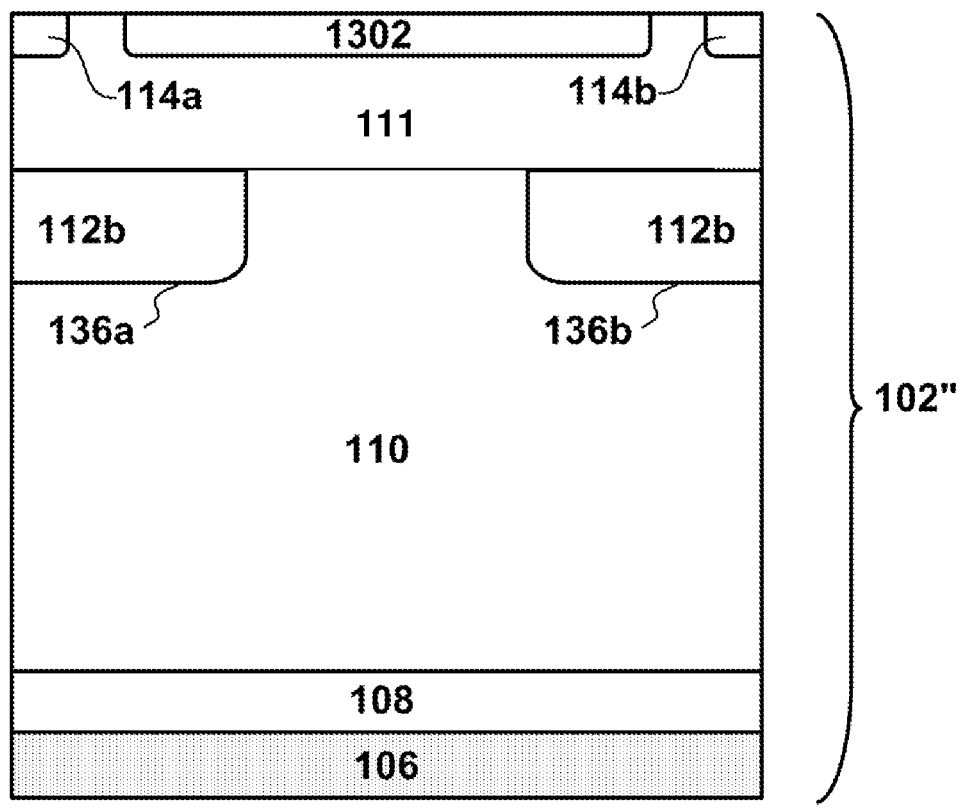
FIG. 13 presents a cross-sectional view of another example silicon carbide structure, in accordance with one or more embodiments described herein.

Referring now to FIG. 13, presented is a cross-sectional view of a silicon carbide structure 102". The silicon carbide structure 102" can be an alternate embodiment of the silicon carbide structure 102. The silicon carbide structure 102" can include the drain electrode 106, the substrate layer 108, the drift layer 110, and the transition layer. The drift layer 110 can include the first p-well region 112*a*, the second p-well region 112*b*. The transition layer 111 can include the first connecting region 114*a*, the second connecting region 114*b*, and a p-shield layer 1302. With the silicon carbide structure 102", the p-shield layer 1302 can be formed in the transition layer 111. For example, the p-shield layer 1302 can be formed between the first connecting region 114*a* and the second connecting region 114*b*.

Figure 14:
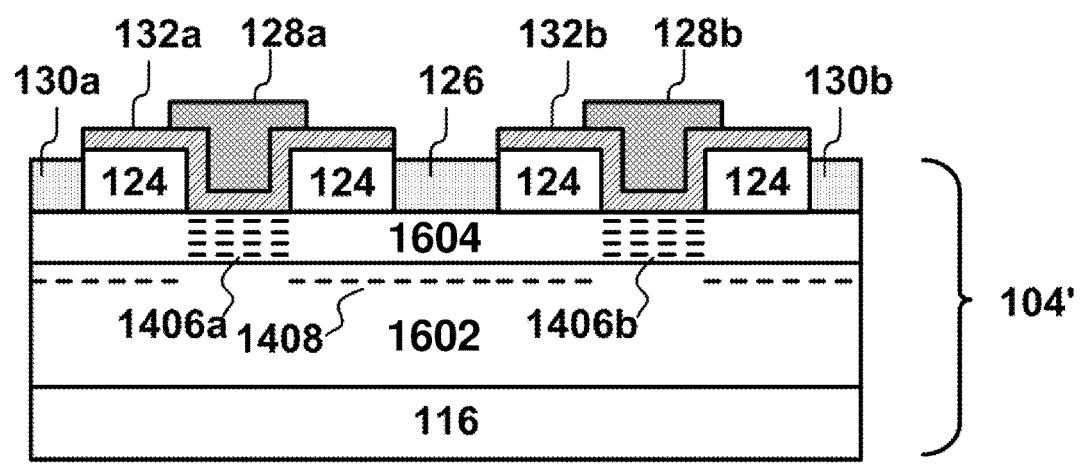
FIG. 14 presents a cross-sectional view of an example III-nitride structure, in accordance with one or more embodiments described herein.

Referring now to FIG. 14, presented is a cross-sectional view of a III-nitride structure 104'. The III-nitride structure 104' can be an alternate embodiment of the III-nitride structure 104. The III-nitride structure 104' can include the nucleation layer 116, the channel layer 1602, the barrier layer 1604, a passivation layer 124, the source electrode 126, a first gate electrode 128*a*, a second gate electrode 128*b*, the first connection electrode 130*a*, the second connection electrode 130*b*, a first gate dielectric 132*a*, and a second gate dielectric 132*b*. The passivation layer 124 can be an insulator layer. In one example, the passivation layer 124 can comprise nitride. In another example, the passivation layer 124 can comprise aluminum gallium nitride layer. In yet another example, the passivation layer 124 can comprise an oxide (e.g., a silicon dioxide). In yet another example, the passivation layer 124 can be a polymer layer. In yet another example, the passivation layer 124 can be a polyimide layer In an embodiment, the passivation layer 124 can correspond to the passivation layer 1608.

The channel layer 1602 can be formed on the nucleation layer 116. The channel layer 1602 can comprise gallium nitride. In an embodiment, the channel layer 1602 can be associated with and/or can include a first channel layer and a second channel layer. Additionally, in an embodiment, the channel layer 1602 can be associated with and/or can include an insertion layer. Furthermore, the barrier layer 1604 can be formed on the channel layer 1602. The barrier layer 1604 can comprise aluminum gallium nitride. With the III-nitride structure 104', the first gate dielectric 132*a* can be formed on the passivation layer 124 and the barrier layer 1604. Furthermore, the second gate dielectric 132*b* can be formed on the passivation layer 124 and the barrier layer 1604. In an embodiment, fluorine ion implantation can be performed with respect to the barrier layer 1604. For example, fluorine ions can be implanted at a first region 1406*a* of the barrier layer 1604 and a second region 1406*b* of the barrier layer 1604. The first region 1406*a* can be implemented under the first gate electrode 128*a* and the second region 1406*b* can be implemented under the second gate electrode 128*b*. Furthermore, the first region 1406*a* and the second region 1406*b* can be regions of negative charge. As such, normally-off operation of the semiconductor device 100 can be realized. In an aspect, the channel layer 1602 can include a 2DEG channel 1408. For example, when a drain voltage is applied to the drain electrode 106, electrons can flow from the source electrode 126 through the 2DEG channel 1408.

Figure 15:
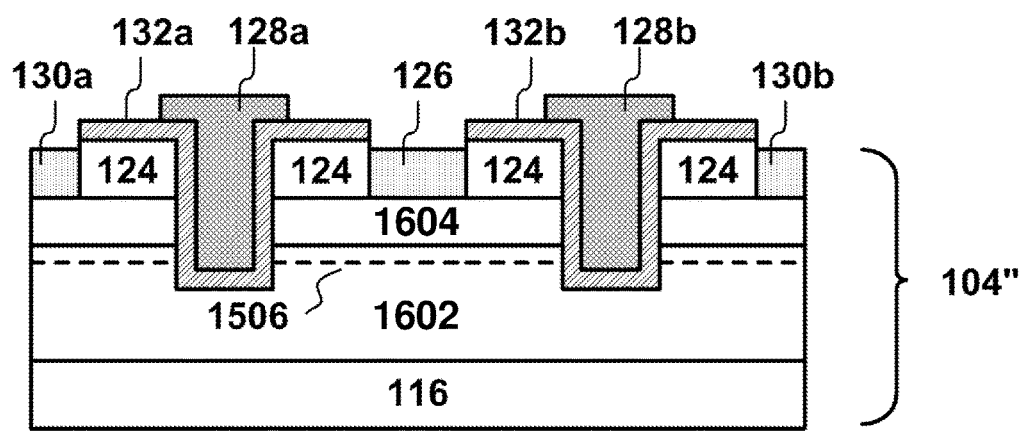
FIG. 15 presents a cross-sectional view of another example III-nitride structure, in accordance with one or more embodiments described herein.

Referring now to FIG. 15, presented is a cross-sectional view of a III-nitride structure 104". The III-nitride structure 104" can be an alternate embodiment of the III-nitride structure 104. The III-nitride structure 104" can include the nucleation layer 116, the channel layer 1602, the barrier layer 1604, the passivation layer 124, the source electrode 126, the first gate electrode 128*a*, the second gate electrode 128*b*, the first connection electrode 130*a*, the second connection electrode 130*b*, the first gate dielectric 132*a*, and the second gate dielectric 132*b*.

With the III-nitride structure 104", the first gate electrode 128*a*, the second gate electrode 128*b*, the first gate dielectric 132*a* and/or the second gate dielectric 132*b* can extend through the passivation layer 124 and the barrier layer 1604. The first gate electrode 128*a*, the second gate electrode 128*b*, the first gate dielectric 132*a* and/or the second gate dielectric 132*b* can also extend through a portion of the channel layer 1602. In an aspect, the channel layer 1602 can include a 2DEG channel 1506. For example, when a drain voltage is applied to the drain electrode 106, electrons can flow from the source electrode 126 through the 2DEG channel 1506. In another aspect, a first recessed structure associated with the first gate electrode 128*a* and a second recessed structure associated with the second gate electrode 128*b* can be employed to achieve normally-off operation of the semiconductor device 100. In one example, a recess depth of a first recessed structure associated with the first gate electrode 128*a* and/or a second recessed structure associated with the second gate electrode 128*b* can be smaller than a barrier thickness of the barrier layer 1604. In another example, a recess depth of a first recessed structure associated with the first gate electrode 128*a* and/or a second recessed structure associated with the second gate electrode 128*b* can be larger than a barrier thickness of the barrier layer 1604.

Figure 16:
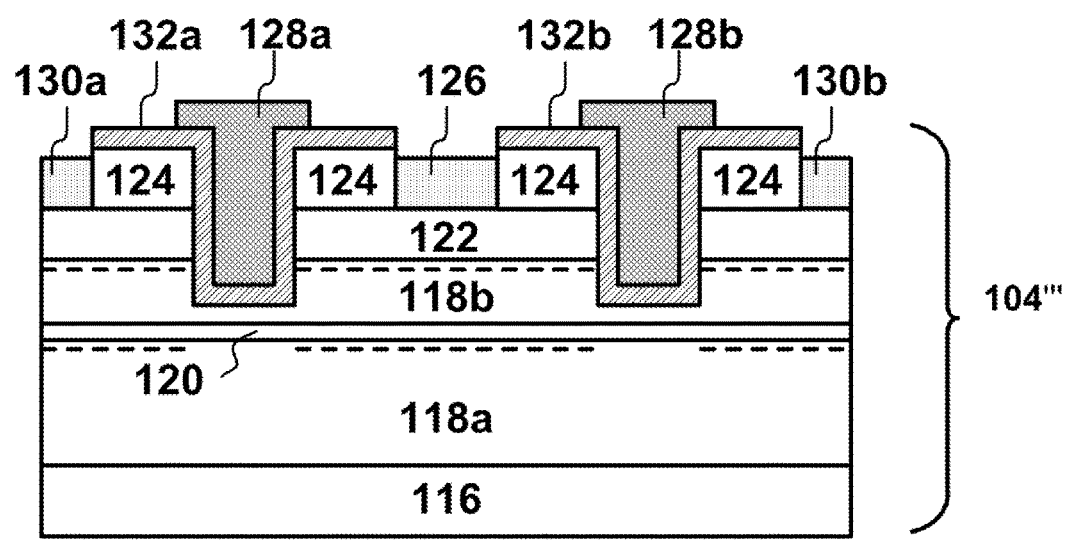
FIG. 16 presents a cross-sectional view of yet another example III-nitride structure, in accordance with one or more embodiments described herein.

Referring now to FIG. 16, presented is a cross-sectional view of a III-nitride structure 104'''. The III-nitride structure 104''' can be an alternate embodiment of the III-nitride structure 104. The III-nitride structure 104''' can include the nucleation layer 116, a first channel layer 118*a*, a second channel layer 118*b*, an insertion layer 120, a barrier layer 122 and/or the passivation layer 124. The first channel layer 118*a*, the second channel layer 118*b*, the insertion layer 120 and/or the barrier layer 122 can be implemented as a set of III-nitride semiconductor layers. In one example, the first channel layer 118*a* can be a first buffer layer and the second channel layer 118*b* can be a second buffer layer. In an aspect, the III-nitride structure 104''' can also include the source electrode 126, the first gate electrode 128*a*, the second gate electrode 128*b*, the first connection electrode 130*a*, the second connection electrode 130*b*, the first gate dielectric 132*a* and/or the second gate dielectric 132*b*. In an embodiment, the semiconductor device 100 with the III-nitride structure 104''' can be a three terminal device with a gate (e.g., the first gate electrode 128a and/or the second gate electrode 128b), a source (e.g., the source electrode 126), and a drain (e.g., the drain electrode 106). In another embodiment, the semiconductor device 100 with the III-nitride structure 104''' can be a four terminal device with a gate (e.g., the first gate electrode 128a and/or the second gate electrode 128b), a source (e.g., the source electrode 126), a drain (e.g., the drain electrode 106), and a connecting electrode (e.g., the first connection electrode 130a, the second connection electrode 130b).

The first channel layer 118a can be formed on the nucleation layer 116. Furthermore, the first channel layer 118a can be formed on the nucleation layer 116, the insertion layer 120 can be formed on the first channel layer 118a, the second channel layer 118b can be formed on the insertion layer 120, and/or the barrier layer 122 can be formed on the second channel layer 118b. The first channel layer 118a and the second channel layer 118b can comprise gallium nitride. The insertion layer 120 and/or the barrier layer 122 can comprise aluminum nitride. In another example, the insertion layer 120 and/or the barrier layer 122 can comprise gallium nitride. In yet another example, the insertion layer 120 and/or the barrier layer 122 can comprise indium nitride. In yet another example, the insertion layer 120 and/or the barrier layer 122 can comprise aluminum gallium nitride. In yet another example, the insertion layer 120 and/or the barrier layer 122 can comprise aluminum indium nitride. In an embodiment, a distance between the insertion layer 120 and the barrier layer 122 can be larger than 1 nanometer and smaller than 30 nm. For example, the insertion layer 120 can comprise a thickness between 1 nanometer and 30 nanometers. In an aspect, the barrier layer 122 and the second channel layer 118b can form a heterojunction where a 2DEG upper channel can be present. Furthermore, the insertion layer 120 and the first channel layer 118a can form a heterojunction where a 2DEG lower channel can be present. In one example, the first gate electrode 1606a and/or the second gate electrode 1606b can be a Schottky barrier contact. In another example, the first gate electrode 1606a and/or the second gate electrode 1606b can be a metal-insulator-semiconductor contact. The source electrode 126, the first gate electrode 1606a, the second gate electrode 1606b, the first connection electrode 130a and/or the second connection electrode 130b can be formed via a metallization process.

The passivation layer 124 can be formed on the barrier layer 122. Additionally, the source electrode 126, the first connection electrode 130a and/or the second connection electrode 130b can be formed on the barrier layer. The source electrode 126 can be an ohmic contact. The source electrode 126 can be electrically coupled to the first p-well region 112a and/or the second p-well region 112b. In an aspect, the first gate electrode 128a, the second gate electrode 128b, the first gate dielectric 132a and/or the second gate dielectric 132b can extend through the barrier layer 122. The first gate electrode 128a, the second gate electrode 128b, the first gate dielectric 132a and/or the second gate dielectric 132b can also extend through a portion of the second channel layer 118b. The first gate electrode 128a and/or the second gate electrode 128b can be electrically isolated from the first channel layer 118a, the second channel layer 118b, the insertion layer 120 and/or the barrier layer 122 (e.g., the set of III-nitride semiconductor layers). For example, the first gate dielectric 132a and/or the second gate dielectric 132b can electrically isolate the first gate electrode 128a and/or the second gate electrode 128b from the first channel layer 118a, the second channel layer 118b, the insertion layer 120 and/or the barrier layer 122 (e.g., the set of III-nitride semiconductor layers). In one example, the first gate electrode 128a and/or the second gate electrode 128b can be a Schottky barrier contact. In another example, the first gate electrode 128a and/or the second gate electrode 128b can be a metal-insulator-semiconductor contact. The source electrode 126, the first gate electrode 128a, the second gate electrode 128b, the first connection electrode 130a and/or the second connection electrode 130b can be formed via a metallization process.

In an aspect, a semiconductor region under the first gate electrode 128a and/or the second gate electrode 128b can receive a negative electrical charge. For example, a negative charge-trapped region located directly underneath the first gate electrode 128a and/or the second gate electrode 128b can be formed via plasma treatment and/or an ion implantation process. The plasma treatment and/or the ion implantation process can be associated with tetrafluoromethane, sulfur hexafluoride and/or boron trifluoride. Furthermore, the semiconductor region under the first gate electrode 128a and/or the second gate electrode 128b can be at least partially recessed. In one example, the semiconductor region under the first gate electrode 128a and/or the second gate electrode 128b can be fully recessed. In yet another aspect, normally-off operation for the semiconductor device 100 can be achieved by etching the passivation layer 124, barrier layer 122, and a portion of the second channel layer 118b. In an embodiment, a p-doped cap layer (e.g., the p-type layer 1610) can be formed between the first gate electrode 128a and/or the barrier layer 122. Additionally or alternatively, the p-doped cap layer can be formed between the second gate electrode 128b and the barrier layer 122. The p-doped cap layer can comprise a p-type semiconductor associated with p-type doping. Furthermore, the p-doped cap layer can be a p-cap layer that is patterned.

In an off-state of the semiconductor device 100 with the III-nitride structure 104''' where a voltage associated with the first gate electrode 128a and/or the second gate electrode 128b (e.g., a gate voltage) is below a threshold voltage value, when a certain voltage is applied to the drain electrode 106 (e.g., a high drain voltage is applied), a particular voltage of the first connecting region 114a and/or the second connecting region 114b can be increased. Furthermore, in the off-state of the semiconductor device 100, when the certain voltage is applied to the drain electrode 106, the first pn-junction 136a and/or the second pn-junction 136b can be reversely biased. Furthermore, a depletion region of the first pn-junction 136a and/or the second pn-junction 136b can be widened. An aperture between the first p-well region 112a and the second p-well region 112b can also be pinched off. Additionally or alternatively, a region above the first p-well region 112a and the second p-well region 112b can be pinched off. Therefore, a particular voltage for the drain electrode 106 (e.g. a high drain voltage) can be sustained by the first pn-junction 136a and/or the second pn-junction 136b. Moreover, voltage at the first connecting region 114a and/or the second connecting region 114b can be portion (e.g., a small portion) of the particular voltage for the drain electrode 106 (e.g., the drain voltage). Since the first connection electrode 130a can be electrically connected to the first connecting region 114a, voltage of the first connection electrode 130a can correspond to voltage of the first connecting region 114a. Similarly, since the second connection electrode 130b can be electrically connected to the second connecting region 114b, voltage of the second connection electrode 130*b* can correspond to voltage of the second connecting region 114*b*. Therefore, the III-nitride structure 104 can sustain a portion of the particular voltage for the drain electrode 106 (e.g., a small portion of the high drain voltage). As such, current collapse and/or gate leakage current can be suppressed in the semiconductor device 100.

In an on-state of the semiconductor device 100 with the III-nitride structure 104''' where a voltage associated with the first gate electrode 128*a* and/or the second gate electrode 128*b* (e.g., a gate voltage) is above a threshold voltage value, when a certain voltage is applied to the drain electrode 106 (e.g., a high drain voltage is applied), electrons can flow from the source electrode 126, through the 2DEG channel, and to the first connection electrode 130*a* and/or the second connection electrode 130*b*. Electrons can also continue to flow from the first connecting region 114*a* and/or the second connecting region 114*b*, through aperture between the first p-well region 112*a* and the second p-well region 112*b*, through the drift layer 110, and to the drain electrode 106. Due to high 2DEG density in the III-nitride structure 104 and high electron mobility of the 2DEG channel, resistance of the silicon carbide structure 102 can be very small as compared to channel resistance of a conventional semiconductor device (e.g., a SiC MOSFET). Furthermore, a gate to drain capacitance can be very minimized in the semiconductor device 100, and switching speed of the semiconductor device 100 can be faster than a conventional semiconductor device (e.g., a SiC MOSFET).

In an embodiment, a set of III-V semiconductor layers (e.g., a set of III-nitride semiconductor layers, etc.) can include the nucleation layer 116, the first channel layer 118*a*, the second channel layer 118*b*, the insertion layer 120 and/or the barrier layer 122 can be formed on the drift layer 110. In an aspect, the nucleation layer 116 can be formed on (e.g., grown on top of) the drift layer 110. In one example, the nucleation layer 116 can comprise gallium nitride (e.g., low temperature gallium nitride). In another example, the nucleation layer 116 can comprise aluminum nitride. In yet another example, the nucleation layer 116 can comprise indium nitride. Additionally or alternatively, the first channel layer 118*a* can be formed on the nucleation layer 116. In one example, the first channel layer 118*a* can comprise gallium nitride. In another example, the first channel layer 118*a* can comprise aluminum nitride. In yet another example, the first channel layer 118*a* can comprise indium nitride. In yet another example, the first channel layer 118*a* can comprise indium gallium nitride. In yet another example, the first channel layer 118*a* can comprise aluminum gallium nitride. Additionally or alternatively, the insertion layer 120 can be formed on the first channel layer 118*a*. In one example, the insertion layer 120 can comprise aluminum nitride. In another example, the insertion layer 120 can comprise gallium nitride nitride. In yet another example, the insertion layer 120 can comprise indium nitride. In yet another example, the insertion layer 120 can comprise aluminum gallium nitride. In yet another example, the insertion layer 120 can comprise aluminum indium nitride. Additionally or alternatively, the second channel layer 118*b* can be formed on the insertion layer 120. In one example, the second channel layer 118*b* can comprise gallium nitride. In another example, the second channel layer 118*b* can comprise aluminum nitride. In yet another example, the second channel layer 118*b* can comprise indium nitride. Additionally or alternatively, the barrier layer 122 can be formed on the second channel layer 118*b*. In one example, the barrier layer 122 can comprise gallium nitride. In another example, the barrier layer 122 can comprise aluminum nitride. In yet another example, the barrier layer 122 can comprise indium nitride. A 2DEF channel can be formed near an interface between the barrier layer 122 and the second channel layer 118*b* due to polarization effects or modulation doping.

In another embodiment, the first connection electrode 130*a* and the second connection electrode 130*b* can be formed on the barrier layer 122. The first connection electrode 130*a* and the second connection electrode 130*b* can be ohmic contacts. Furthermore, the first connection electrode 130*a* can be connected (e.g., electrically coupled) to the first connecting region 114*a* and the second connection electrode 130*b* can be connected (e.g., electrically coupled) to the second connecting region 114*b*. A portion of the barrier layer 122, the second channel layer 118*b*, the insertion layer 120, the first channel layer 118*a* and the nucleation layer 116 can be etched to facilitate a connection between the first connection electrode 130*a* and the first connecting region 114*a*. Additionally, another portion of the barrier layer 122, the second channel layer 118*b*, the insertion layer 120, the first channel layer 118*a* and the nucleation layer 116 can be etched to facilitate another connection between the second connection electrode 130*b* and the second connecting region 114*b*. Etching can include, for example, a wet etching process, a dry etching process, ICP etching, etc. In an aspect, a metal deposition process and/or a thermal annealing process can also be performed to facilitate a connection between the first connection electrode 130*a* and the first connecting region 114*a*, and/or another connection between the second connection electrode 130*b* and the second connecting region 114*b*.

In yet another embodiment, the source electrode 126 can also be formed on the barrier layer 122. The source electrode 126 can be an ohmic contact. Furthermore, the source electrode 126 can be connected (e.g., electrically coupled) to the first p-well region 112*a* and/or the second p-well region 112*b*. A portion of the barrier layer 122, the second channel layer 118*b*, the insertion layer 120, the first channel layer 118*a*, the nucleation layer 116 and the drift layer 110 can be etched to facilitate a connection between the source electrode 126 and a p-well region (e.g., the first p-well region 112*a* and/or the second p-well region 112*b*) of the semiconductor device 100. In an aspect, a metal deposition process and/or a thermal annealing process can also be performed to facilitate a connection between the source electrode 126 and a p-well region (e.g., the first p-well region 112*a* and/or the second p-well region 112*b*) of the semiconductor device 100.

In certain embodiments, the passivation layer 124 can be formed on the barrier layer 122. For example, a first portion of the passivation layer 124 can be formed between the first connection electrode 130*a* and the source electrode 126. Furthermore, a second portion of the passivation layer 124 can be formed between the source electrode 126 and the second connection electrode 130*b*. In one example, the passivation layer 124 can comprise nitride. In another example, the passivation layer 124 can comprise aluminum gallium nitride layer. In yet another example, the passivation layer 124 can comprise an oxide (e.g., a silicon dioxide). In yet another example, the passivation layer 124 can be a polymer layer. In yet another example, the passivation layer 124 can be a polyimide layer.

In certain embodiments, a first gate window and a second gate window can be formed in the passivation layer 124, the barrier layer 122 and a portion of the second channel layer 118*b*. For example, the first gate window and the second gate window can be etched openings (e.g., a recessed area) to facilitate formation of the first gate electrode 128*a* and the second gate electrode 128b. The first gate window and the second gate window can be formed via an etching process. For example, a first area between the first connection electrode 130a and the source electrode 126 can be etched to facilitate formation of the first gate window. Furthermore, a second area between the source electrode 126 and the first connection electrode 130a can be etched to facilitate formation of the second gate window.

In yet another embodiment, the first gate dielectric 132a and the first gate electrode 128a can be formed in the first gate window 1002. Furthermore, the second gate dielectric 132b and the second gate electrode 128b can be formed in the second gate window 1004. The first gate dielectric 132a and the second gate dielectric 132b can be an insulator. The first gate dielectric 132a can be deposited in the first gate window 1002. Furthermore, the first gate electrode 128a can be formed on the first gate dielectric 132a. The first gate dielectric 132a can cover at least the first gate window 1002. The second gate dielectric 132b can be deposited in the second gate window 1004. Furthermore, the second gate electrode 128b can be formed on the second gate dielectric 132b. The second gate dielectric 132b can cover at least the second gate window 1004. As such, the first gate electrode 128a and the second gate electrode 128b can be electrically isolated from other portions of the device structure 1100 (e.g., other layers of the semiconductor device 100).

Figure 17:
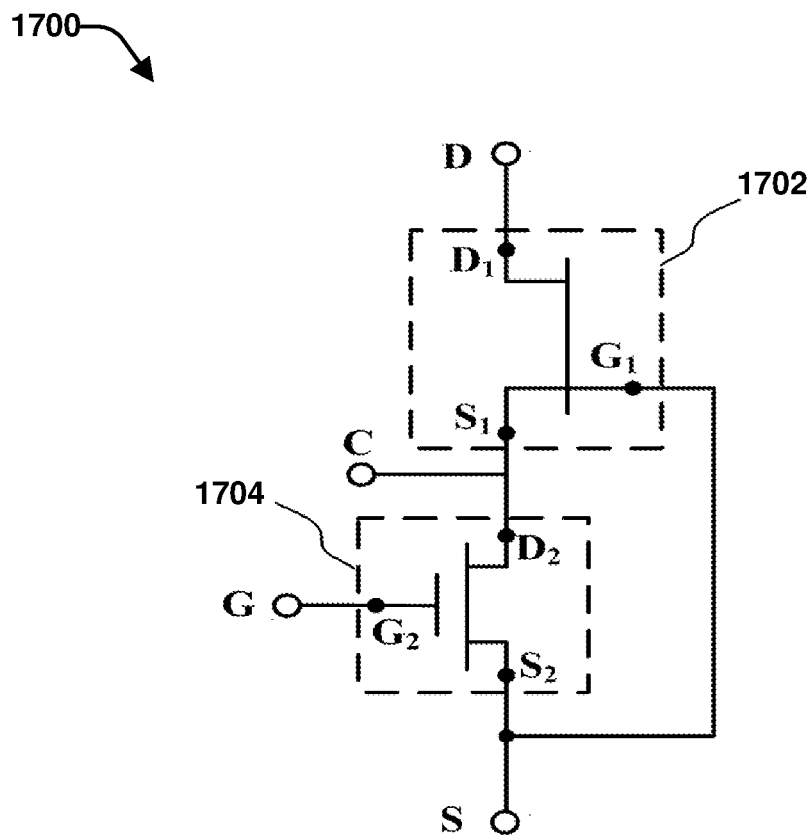
FIG. 17 presents a circuit diagram that corresponds to an example semiconductor device, in accordance with one or more embodiments described herein.

Referring now to FIG. 17, presented is a circuit diagram 1700 that corresponds to the semiconductor device 100. For example, the circuit diagram 1700 can represent a switch device that corresponds to the semiconductor device 100. The circuit diagram 1700 can include a voltage blocking component 1702 and a current-control component 1704. The voltage blocking component 1702 can correspond to the silicon carbide structure 102 (or the silicon carbide structure 102', or the silicon carbide structure 102"). In one example, the voltage blocking component 1702 can be a silicon carbide JFET (e.g., a normally-on silicon carbide JFET). The current-control component 1704 can correspond to the III-nitride structure 104 (or the III-nitride structure 104', or the III-nitride structure 104", or the III-nitride structure 104'''). In one example, the current-control component 1704 can be a III-nitride HEMT (e.g., a low voltage III-V semiconductor HEMT). The current-control component 1704 and the voltage blocking component 1702 can be connected in a cascade configuration. A source $S_1$ of the voltage blocking component 1702 can be electrically connected to a drain $D_2$ of the current-control component 1704. Furthermore, a gate $G_1$ of the voltage blocking component 1702 can be electrically connected to a source $S_2$ of the current-control component 1704. In an embodiment, the circuit diagram 1700 can correspond to a three terminal device (e.g., a three terminal semiconductor device) with a gate node G, a source node S, and a drain node D. The voltage blocking component 1702 can include a drain $D_1$ associated with the drain node D. The current-control component 1704 can include a gate $G_2$ associated with the gate node G. Furthermore, the source $S_2$ of the current-control component 1704 can also be associated with the source node S. In another embodiment, the circuit diagram 1700 can correspond to a four terminal device (e.g., a four terminal semiconductor device) with the gate node G, the source node S, the drain node D, and a connecting node C. A node that connects the source $S_1$ and the drain $D_2$ can be associated with the connecting node C. In an aspect, the gate node G can correspond to the first gate electrode 1606a and the second gate electrode 1606b, the source node S can correspond to the source electrode 126, the drain node D can correspond to the drain electrode 106, and the connecting node C can correspond to the first connection electrode 130a and the second connection electrode 130b. In another aspect, the gate node G can correspond to the first gate electrode 128a and the second gate electrode 128b, the source node S can correspond to the source electrode 126, the drain node D can correspond to the drain electrode 106, and the connecting node C can correspond to the first connection electrode 130a and the second connection electrode 130b.

Figure 18:
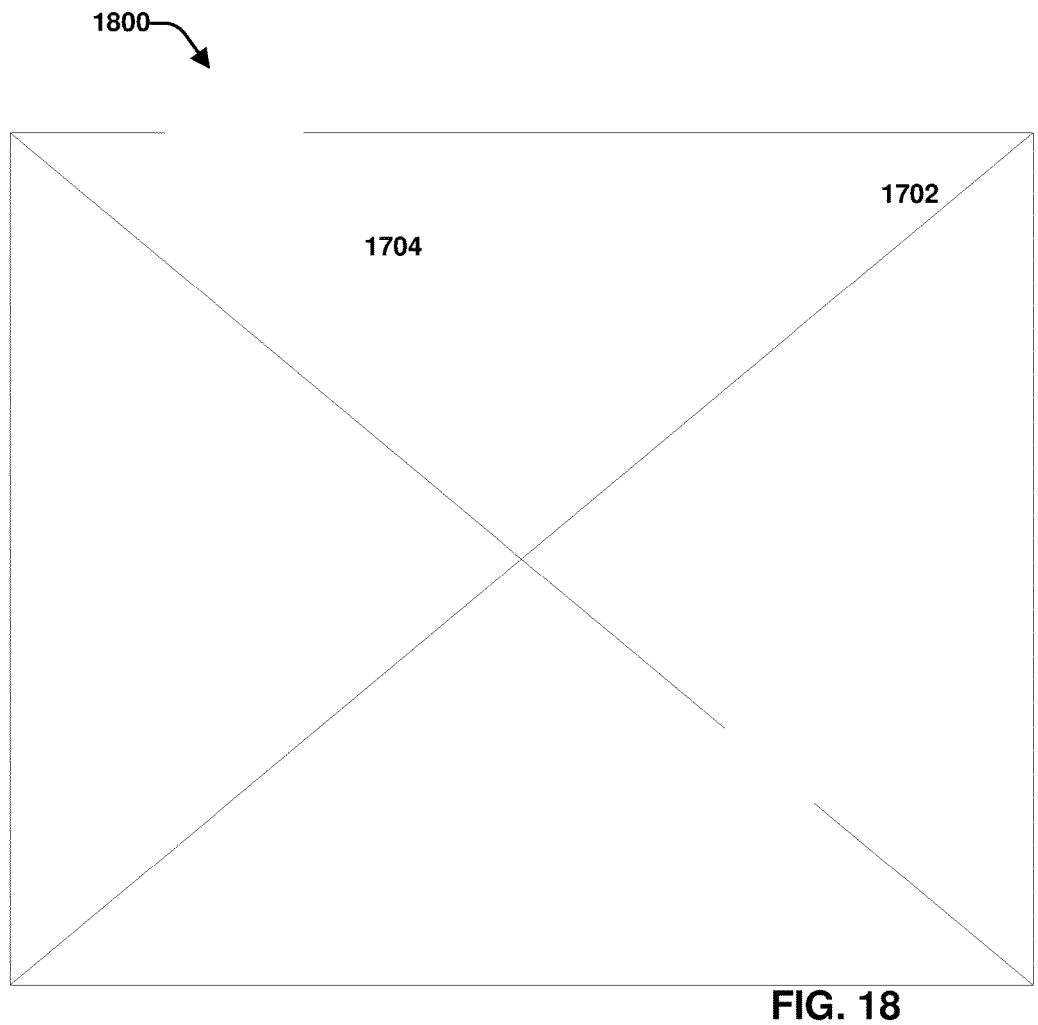
FIG. 18 presents an example semiconductor device, in accordance with one or more embodiments described herein.

Referring now to FIG. 18, presented is a semiconductor device 1800. The semiconductor device 1800 can be a switch device that corresponds to the semiconductor device 100. The semiconductor device 1800 can include another embodiment of the voltage blocking component 1702 and the current-control component 1704. With the semiconductor device 1800, the voltage blocking component 1702 can be fabricated on a first chip and the current-control component 1704 can be fabricated on a second chip. The semiconductor device 1800 can be a single package that includes the first chip associated with the voltage blocking component 1702 and the second chip associated with the current-control component 1704. For instance, the voltage blocking component 1702 and the voltage blocking component 1702 can be enclosed by a semiconductor package associated with the semiconductor device 1800. As shown in FIG. 18, the source $S_1$ of the voltage blocking component 1702 can be electrically connected to a drain $D_2$ of the current-control component 1704. Furthermore, the gate $G_1$ of the voltage blocking component 1702 can be electrically connected to a source $S_2$ of the current-control component 1704. The semiconductor device 1800 can be a three terminal semiconductor device that includes the gate node G, the source node S, and the drain node D. The voltage blocking component 1702 can include the drain D associated with the drain node D. The current-control component 1704 can include the gate $G_2$ associated with the gate node G. Furthermore, the source $S_2$ of the current-control component 1704 can also be associated with the source node S. In an aspect, the gate node G can correspond to the first gate electrode 1606a and the second gate electrode 1606b, the source node S can correspond to the source electrode 126, and the drain node D can correspond to the drain electrode 106. In another aspect, the gate node G can correspond to the first gate electrode 128a and the second gate electrode 128b, the source node S can correspond to the source electrode 126, and the drain node D can correspond to the drain electrode 106.

Figure 19:
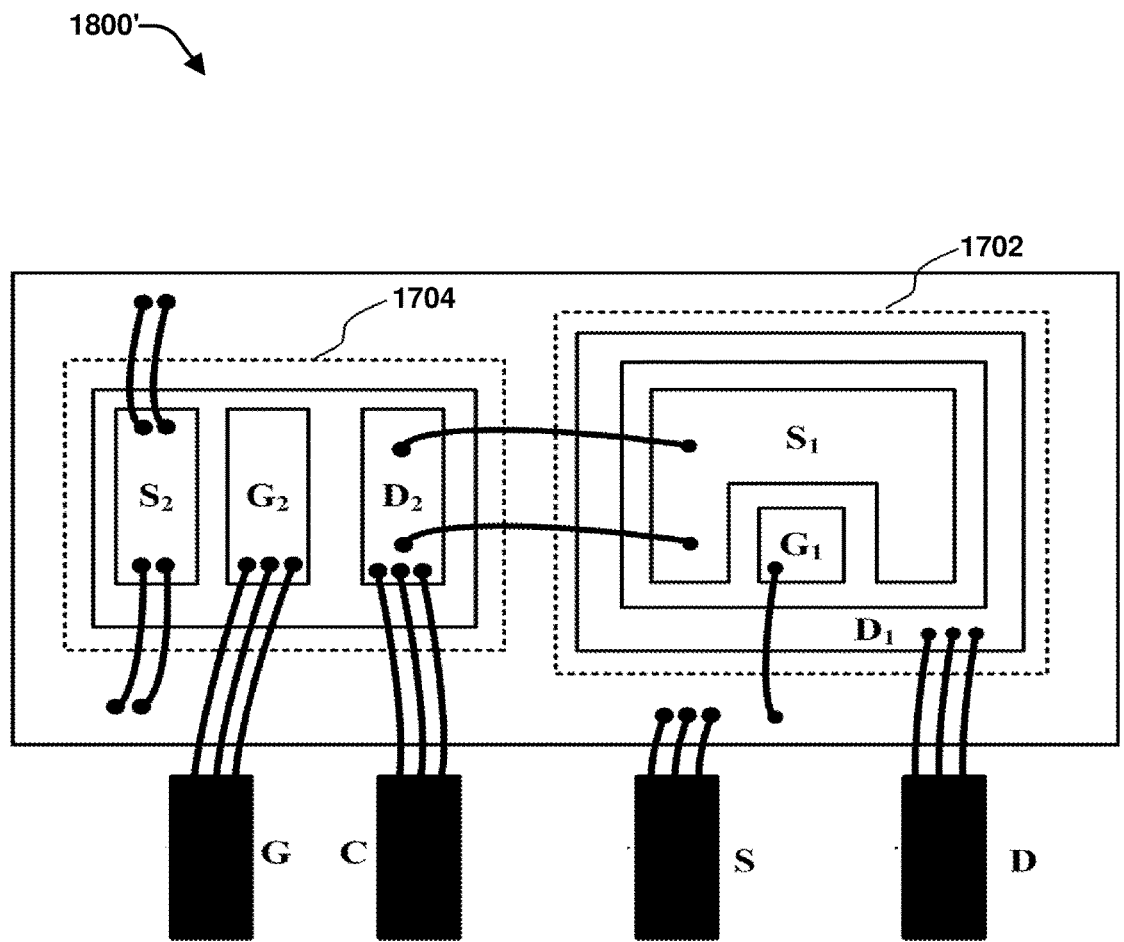
FIG. 19 presents another example semiconductor device, in accordance with one or more embodiments described herein.

Referring now to FIG. 19, presented is a semiconductor device 1800'. The semiconductor device 1800' can be a switch device that corresponds to the semiconductor device 100. Furthermore, the semiconductor device 1800' can be an alternate embodiment of the semiconductor device 1800. The semiconductor device 1800' can include another embodiment of the voltage blocking component 1702 and the current-control component 1704. With the semiconductor device 1800', the voltage blocking component 1702 can be fabricated on a first chip and the current-control component 1704 can be fabricated on a second chip. The semiconductor device 1800' can be a single package that includes the first chip associated with the voltage blocking component 1702 and the second chip associated with the current-control component 1704. As shown in FIG. 19, the source $S_1$ of the voltage blocking component 1702 can be electrically connected to a drain $D_2$ of the current-control component 1704. Furthermore, the gate $G_1$ of the voltage blocking component 1702 can be electrically connected to a source $S_2$ of the current-control component 1704. The semiconductor device 1800' can be a four terminal semiconductor device that includes the gate node G, the source node S, the drain node D, and the connecting node C. The voltage blocking component 1702 can include the drain $D_1$ associated with the drain node D. The current-control component 1704 can include the gate $G_2$ associated with the gate node G. Furthermore, the source $S_2$ of the current-control component 1704 can also be associated with the source node S. The connecting node C can be electrically coupled to the drain $D_2$, which is also electrically coupled to the source $S_1$. In an aspect, the gate node G can correspond to the first gate electrode 1606a and the second gate electrode 1606b, the source node S can correspond to the source electrode 126, the drain node D can correspond to the drain electrode 106, and the connecting node C can correspond to the first connection electrode 130a and the second connection electrode 130b. In another aspect, the gate node G can correspond to the first gate electrode 128a and the second gate electrode 128b, the source node S can correspond to the source electrode 126, the drain node D can correspond to the drain electrode 106, and the connecting node C can correspond to the first connection electrode 130a and the second connection electrode 130b.

Figure 20:
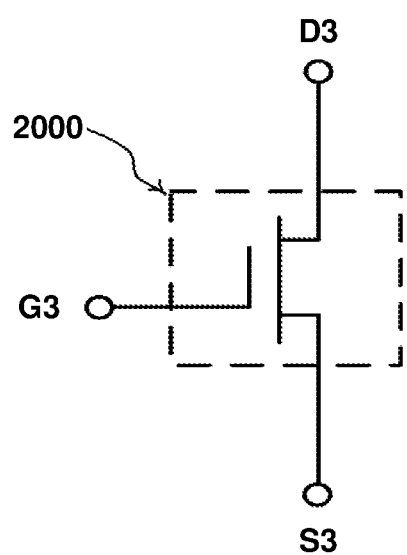
FIG. 20 presents another circuit diagram that corresponds to an example semiconductor device, in accordance with one or more embodiments described herein.

Referring now to FIG. 20, presented is a circuit diagram 2000 that corresponds to the semiconductor device 100. For example, the circuit diagram 2000 can represent a switch device that corresponds to the semiconductor device 100. The circuit diagram 2000 can be, for example, a GaN/SiC HyFET. Furthermore, the circuit diagram 2000 can be a three terminal device (e.g., a three terminal semiconductor device) that includes a gate node G3, a source node S3, and a drain node D3. In an aspect, the gate node G3 can correspond to the first gate electrode 1606a and the second gate electrode 1606b, the source node S3 can correspond to the source electrode 126, and the drain node D3 can correspond to the drain electrode 106. In another aspect, the gate node G3 can correspond to the first gate electrode 128a and the second gate electrode 128b, the source node S3 can correspond to the source electrode 126, and the drain node D3 can correspond to the drain electrode 106.

Figure 21:
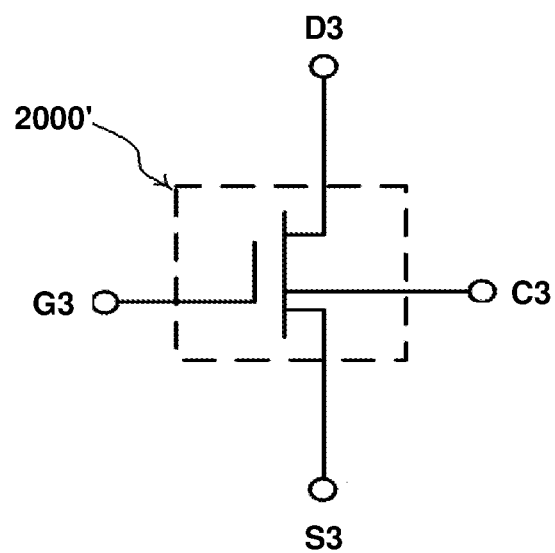
FIG. 21 presents yet another circuit diagram that corresponds to an example semiconductor device, in accordance with one or more embodiments described herein.

Referring now to FIG. 21, presented is a circuit diagram 2000' that corresponds to the semiconductor device 100. For example, the circuit diagram 2000' can represent a switch device that corresponds to the semiconductor device 100. The circuit diagram 2000' can be an alternate embodiment of the circuit diagram 2000. The circuit diagram 2000' can be, for example, a GaN/SiC HyFET. Furthermore, the circuit diagram 2000' can be a four terminal device (e.g., a four terminal semiconductor device) that includes the gate node G3, the source node S3, the drain node D3, and a connecting node C3. In an aspect, the gate node G3 can correspond to the first gate electrode 1606a and the second gate electrode 1606b, the source node S3 can correspond to the source electrode 126, the drain node D3 can correspond to the drain electrode 106, and the connecting node C3 can correspond to the first connection electrode 130a and the second connection electrode 130b. In another aspect, the gate node G3 can correspond to the first gate electrode 128a and the second gate electrode 128b, the source node S3 can correspond to the source electrode 126, the drain node D3 can correspond to the drain electrode 106, and the connecting node C3 can correspond to the first connection electrode 130a and the second connection electrode 130b.

Figure 22:
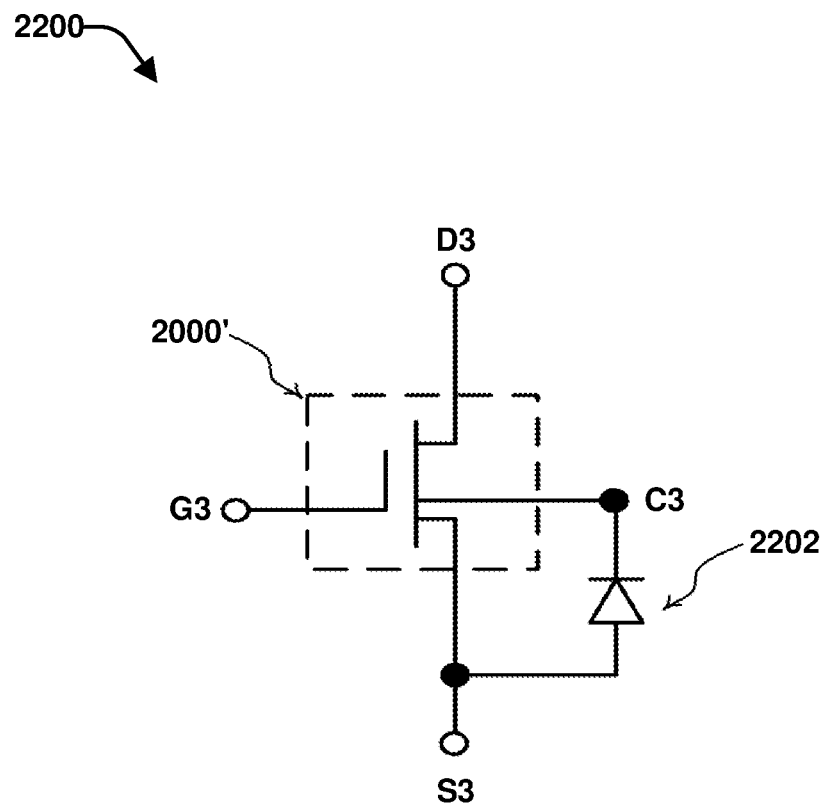
FIG. 22 presents yet another circuit diagram that corresponds to an example semiconductor device, in accordance with one or more embodiments described herein.

Referring now to FIG. 22, presented is a circuit diagram 2200 that corresponds to the semiconductor device 100. For example, the circuit diagram 2200 can represent a switch device that corresponds to the semiconductor device 100. The circuit diagram 2200 can include the circuit diagram 2000' and a diode 2202. For example, a cathode of the diode 2202 can be coupled (e.g., connected, electrically coupled) to the connecting node C3. Furthermore, an anode of the diode 2202 can be coupled (e.g., connected, electrically coupled) to the source node S3. The diode 2202 can be employed to set a threshold voltage for the circuit diagram 2000'. A breakdown voltage of the diode 2202 can be lower than a maximum voltage the III-nitride channel portion can withstand. Therefore, the diode 2202 can be employed to prevent the III-nitride channel portion from receiving a particular voltage that is higher than a maximum voltage that the III-nitride channel portion can withstand. Therefore, the diode 2202 can be employed to prevent the circuit diagram 2000' (e.g., a controlling portion of the circuit diagram 2000') from receiving a particular voltage that is higher than a maximum voltage that the circuit diagram 2000' can withstand. In an embodiment, the diode 2202 can be enclosed in a single semiconductor package associated with the circuit diagram 2000' (e.g., a single semiconductor package with a silicon carbide JFET chip and a gallium nitride semiconductor HEMT chip). In another embodiment, the diode 2202 and the circuit diagram 2000' (e.g., a silicon carbide JFET chip and a gallium nitride semiconductor HEMT chip) can be implemented in different semiconductor packages.

Figure 23:
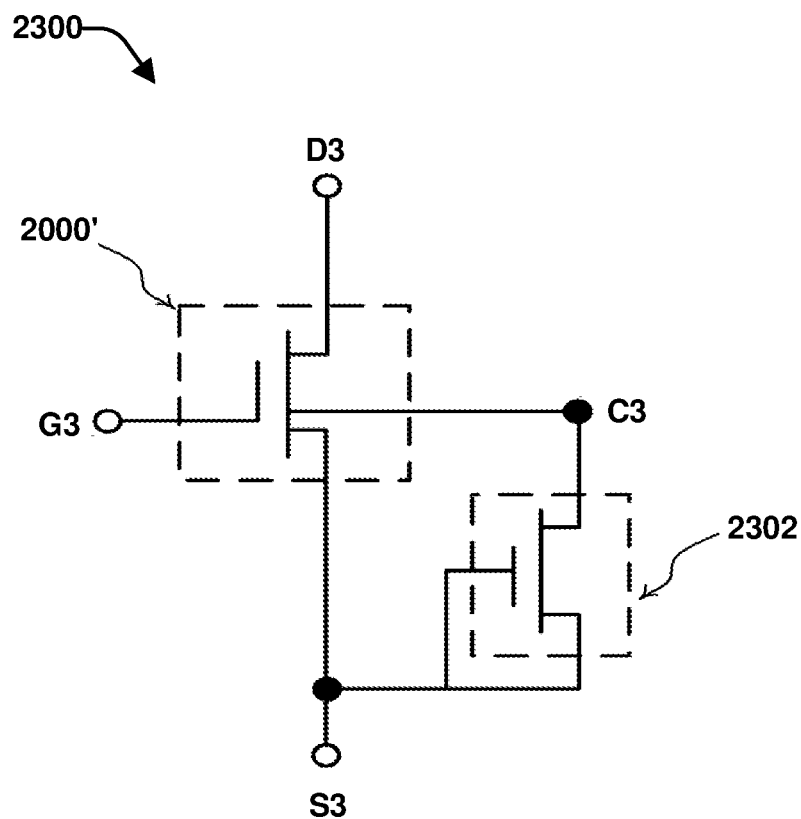
FIG. 23 presents yet another circuit diagram that corresponds to an example semiconductor device, in accordance with one or more embodiments described herein.

Referring now to FIG. 23, presented is a circuit diagram 2300 that corresponds to the semiconductor device 100. For example, the circuit diagram 2300 can represent a switch device that corresponds to the semiconductor device 100. The circuit diagram 2300 can include the circuit diagram 2000' and a transistor 2302. The transistor 2302 can be, for example, a silicon transistor. A drain of the transistor 2302 can be coupled (e.g., connected, electrically coupled) to the connecting node C3. Furthermore, a source and gate of the transistor 2302 can be coupled (e.g., connected, electrically coupled) to the source node S3. The transistor 2302 can be employed to set a threshold voltage for the circuit diagram 2000'. A breakdown voltage of the transistor 2302 can be lower than a maximum voltage the III-nitride channel portion can withstand. Therefore, the transistor 2302 can be employed to prevent the III-nitride channel portion from receiving a particular voltage that is higher than a maximum voltage that the III-nitride channel portion can withstand. In an embodiment, the transistor 2302 can be enclosed in a single semiconductor package associated with the circuit diagram 2000' (e.g., a single semiconductor package with a silicon carbide JFET chip and a gallium nitride semiconductor HEMT chip). In another embodiment, the transistor 2302 and the circuit diagram 2000' (e.g., a silicon carbide JFET chip and a gallium nitride semiconductor HEMT chip) can be implemented in different semiconductor packages.

FIGS. 24-30 provide simulation data demonstrating superior characteristics of a semiconductor device and/or a switch device (e.g., semiconductor device 100), as disclosed herein. Repetitive description of like elements employed in other embodiments described herein is omitted for sake of brevity.

Figure 24:
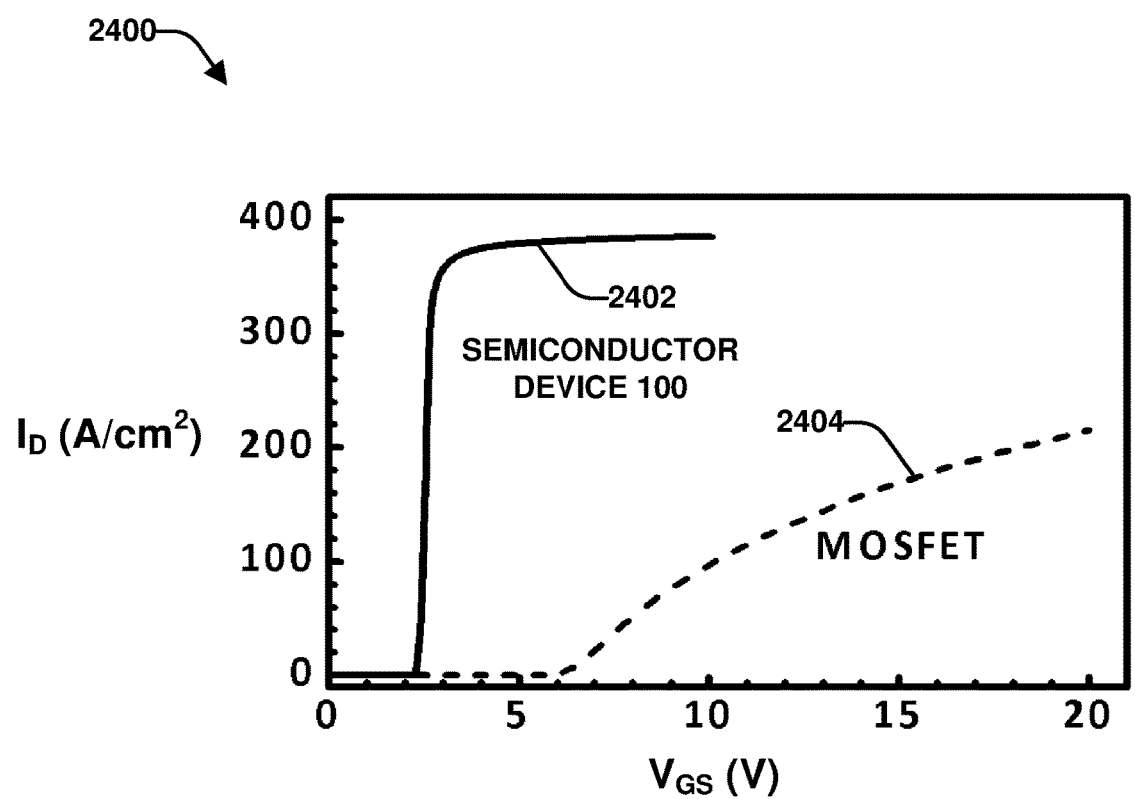
FIG. 24 presents a graph illustrating transfer characteristics of a semiconductor device disclosed herein, in accordance with one or more embodiments described herein.

FIG. 24 provides a graph 2400 illustrating transfer characteristics of the semiconductor device 100. An x-axis of the graph 2400 represents a gate-source voltage $V_{GS}$ and a y-axis of the graph 2400 represents a drain current $I_D$. As shown in the graph 2400, transfer characteristics 2402 of the semiconductor device 100 is higher than transfer characteristics 2404 of a conventional MOSFET device (e.g., a conventional SiC MOSFET device). The transfer characteristics 2402 of the semiconductor device 100 can be higher than the transfer characteristics 2404 of the conventional MOSFET device due to, for example, at least a higher channel mobility associated with the semiconductor device 100. For transfer characteristics shown in the graph 2400, a drain-source voltage can be equal to, for example, 1V.

Figure 25:
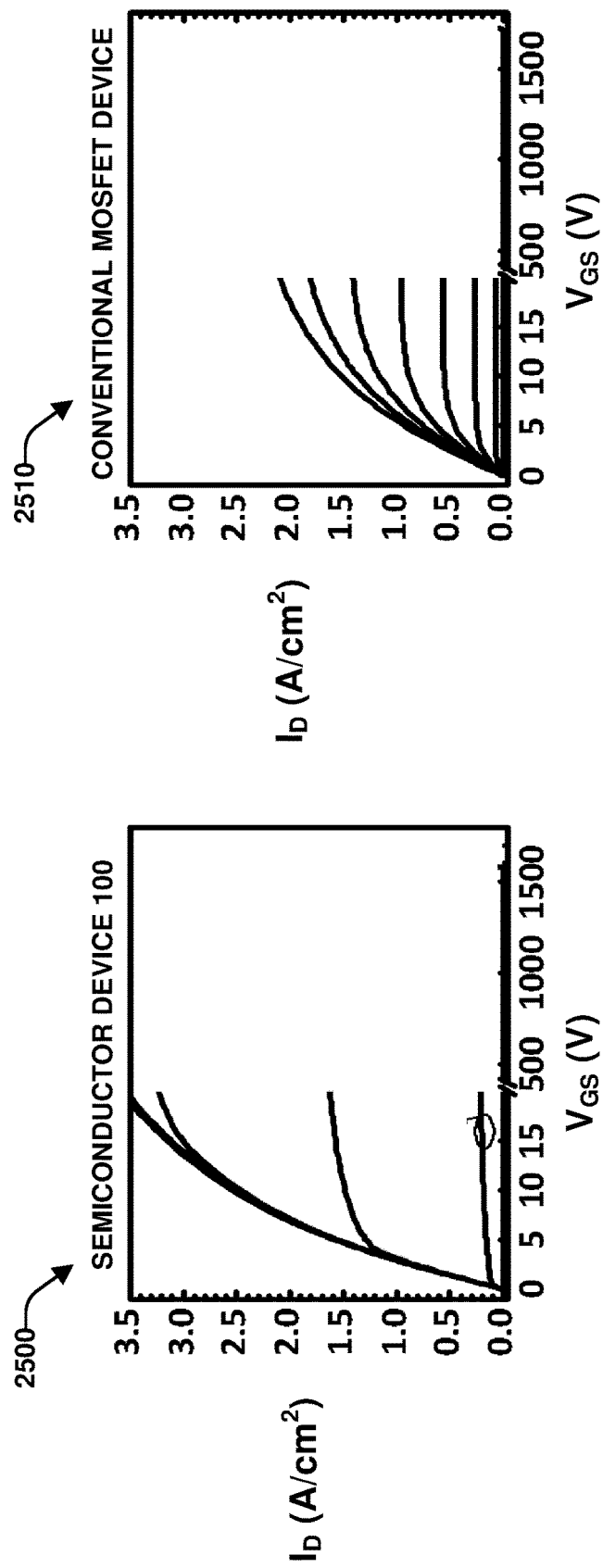
FIG. 25 presents graphs illustrating current-voltage output characteristics of a semiconductor device disclosed herein and a conventional MOSFET device, in accordance with one or more embodiments described herein.

FIG. 25 provides a graph 2500 illustrating current-voltage output characteristics of the semiconductor device 100. FIG. 25 also provides a graph 2510 illustrating current-voltage output characteristics of a conventional MOSFET device (e.g., a conventional SiC MOSFET device). An x-axis of the graph 2500 and the graph 2510 represents a gate-source voltage $V_{GS}$. A y-axis of the graph 2500 and the graph 2510 represents a drain current $I_D$. As shown in the graph 2500, on-state resistance of the semiconductor device 100 can be lower than on-state resistance of a conventional MOSFET device shown in the graph 2510 due to at least a higher channel mobility associated with the semiconductor device 100. Furthermore, breakdown voltage of the semiconductor device 100 can be approximately equal to breakdown voltage of a conventional MOSFET device. Additionally, a gate-source voltage of the semiconductor device 100 can be in a range of approximately 2.5V to 5V, and a gate-source voltage of a conventional MOSFET device can be approximately 20V. Furthermore, a step voltage of the semiconductor device 100 can be equal to, for example, 0.5V and a step voltage of the conventional MOSFET device can be equal to, for example, 2.0V.

Figure 26:
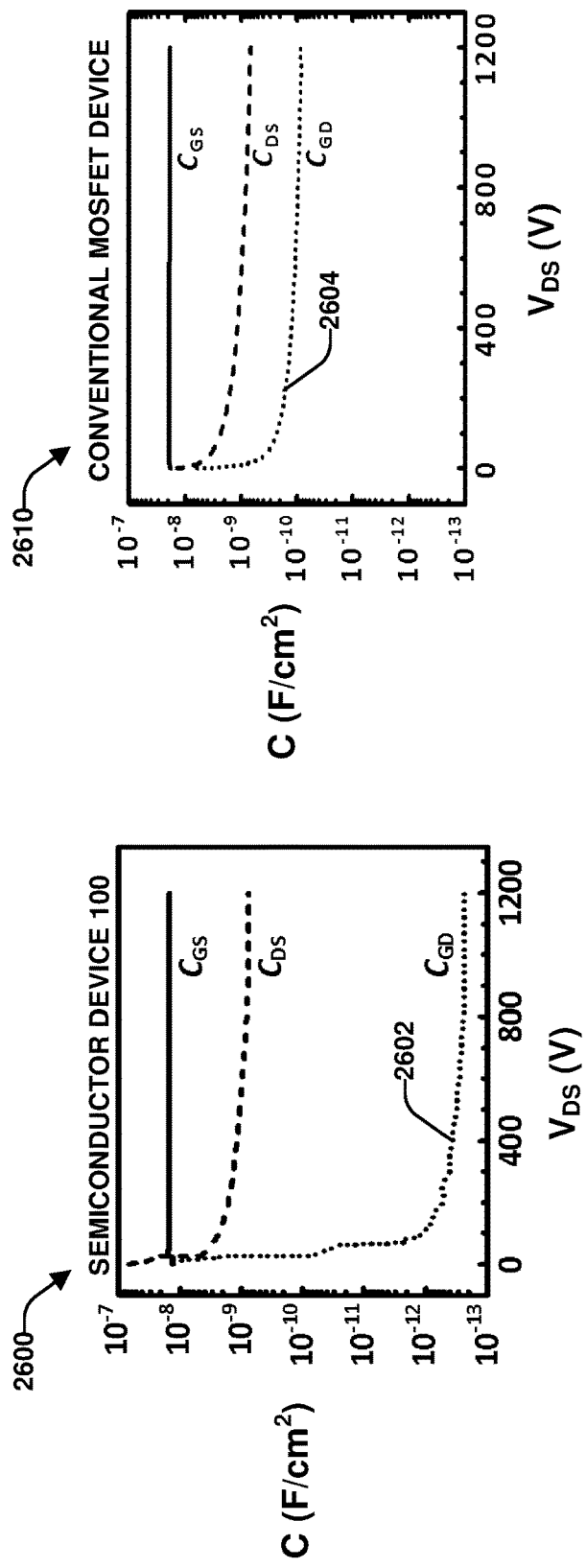
FIG. 26 presents graphs illustrating terminal capacitance of a semiconductor device disclosed herein and a conventional MOSFET device, in accordance with one or more embodiments described herein.

FIG. 26 provides a graph 2600 illustrating terminal capacitance of the semiconductor device 100. FIG. 26 also provides a graph 2610 illustrating terminal capacitance of a conventional MOSFET device (e.g., a conventional SiC MOSFET device). An x-axis of the graph 2600 and the graph 2610 represents a drain-source voltage $V_{DS}$. A y-axis of the graph 2600 and the graph 2610 represents a capacitance C. An a gate-to-source capacitance $C_{GS}$ (e.g., input capacitance), a drain-to-source capacitance $C_{DS}$ (e.g., output capacitance), and a gate-to-drain capacitance $C_{GD}$ (e.g., a reverse transfer capacitance) are plotted the graph 2600 and the graph 2610. As shown in the graph 2600, a gate-to-drain capacitance 2602 of the semiconductor device 100 is lower than gate-to-drain capacitance 2604 of a conventional MOSFET device shown in the graph 2610. A lower gate-to-drain capacitance of the semiconductor device 100 can be due to lateral configuration of a current-control portion of the semiconductor device 100 and/or elimination of a gate-to-drift overlap (e.g., elimination of an overlap between a gate and an open drift region, elimination of an overlap between a gate and a n+ source region) with respect to the semiconductor device 100. As such, the semiconductor device 100 can achieve a faster switching speed than a conventional MOSFET device.

Figure 27:
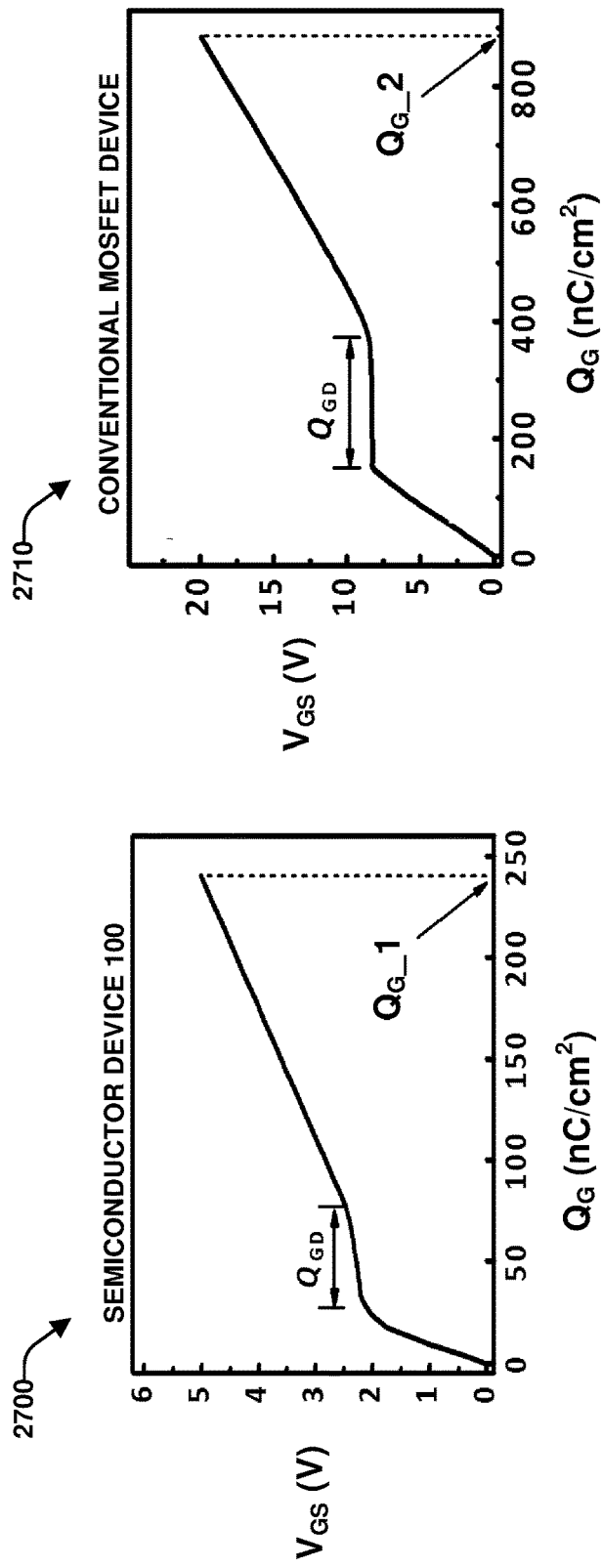
FIG. 27 presents graphs illustrating gate charge of a semiconductor device disclosed herein and a conventional MOSFET device, in accordance with one or more embodiments described herein.

FIG. 27 provides a graph 2700 illustrating gate charge of the semiconductor device 100. FIG. 27 also provides a graph 2710 illustrating gate charge of a conventional MOSFET device (e.g., a conventional SiC MOSFET device). An x-axis of the graph 2700 and the graph 2710 represents a charge $Q_G$. A y-axis of the graph 2700 and the graph 2710 represents a gate-source voltage $V_{GS}$. As shown in the graph 2700, a gate charge $Q_{G\_1}$ of the semiconductor device 100 can be lower than a gate charge $Q_{G\_2}$ of a conventional MOSFET device shown in the graph 2710. For example, the gate charge $Q_{G\_2}$ of a conventional MOSFET device can be equal to 885 nC/cm² when a current load is equal to 100 A/cm² and a supply voltage is equal to 600V. In contrast, the gate charge $Q_{G\_1}$ of the semiconductor device 100 can be equal to 239 nC/cm² when a current load is equal to 100 A/cm² and a supply voltage is equal to 600V. Therefore, an electrical property $R_{on} \times Q_G$ of the semiconductor device 100 can be lower than that of a conventional MOSFET device.

Figure 28:
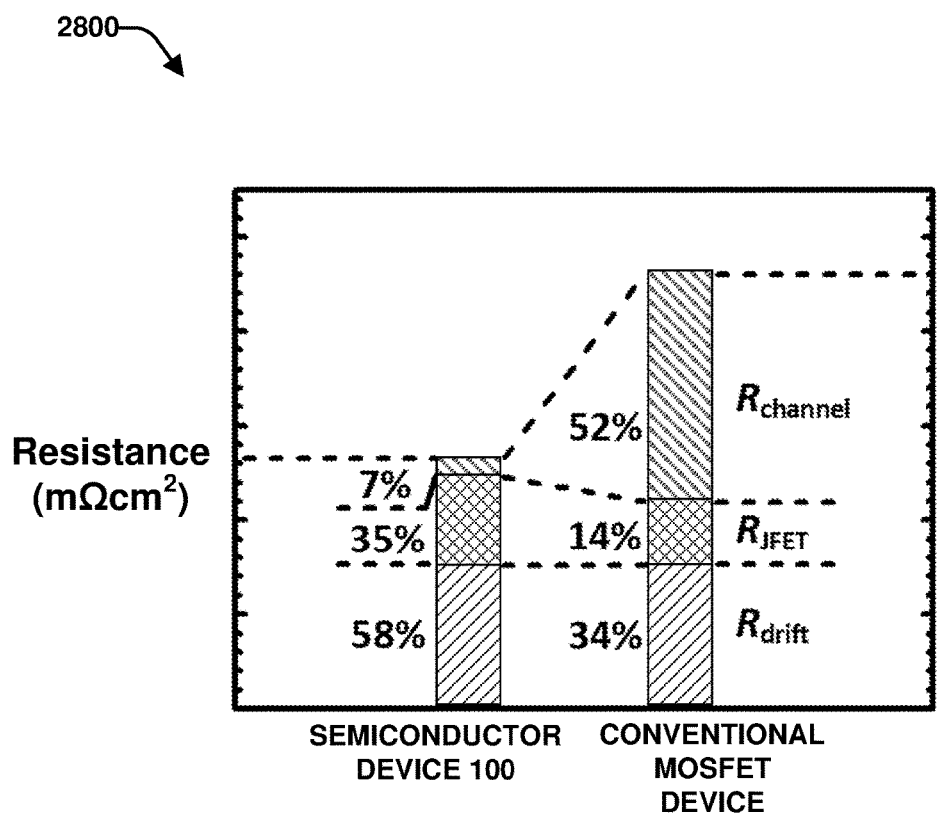
FIG. 28 present a graph illustrating a resistance of a semiconductor device disclosed herein and a conventional MOSFET device, in accordance with one or more embodiments described herein.

FIG. 28 provides a graph 2800 illustrating a resistance of the semiconductor device 100 and a conventional MOSFET device (e.g., a conventional SiC MOSFET device). An x-axis of the graph 2800 includes a bar graph indicator for the semiconductor device 100 and a bar graph indicator for a conventional MOSFET device. A y-axis of the graph 2800 represents a resistance. As shown in the graph 2800, a resistance of the semiconductor device 100 can be lower than a resistance of a conventional MOSFET device. For example, a resistance for a conventional MOSFET device can be equal to 4.6 mΩcm². In contrast, a resistance for the semiconductor device 100 can be equal to 2.9 mΩcm². Additionally, the semiconductor device 100 can be associated with a smaller channel resistance $R_{channel}$ than a conventional MOSFET device. For example, channel resistance $R_{channel}$ of the semiconductor device 100 can be reduced compared to a conventional MOSFET device due to higher channel mobility of the semiconductor device 100. Moreover, resistance from a JFET region for the semiconductor device 100 can be higher than a JFET region of a conventional MOSFET device due to an additional conduction path in a silicon carbide region of the semiconductor device 100 (e.g., a silicon carbide region above p-wells of the semiconductor device 100). Total on-resistance of the semiconductor device 100 can also be lower than total on-resistance of a conventional MOSFET device.

Figure 29:
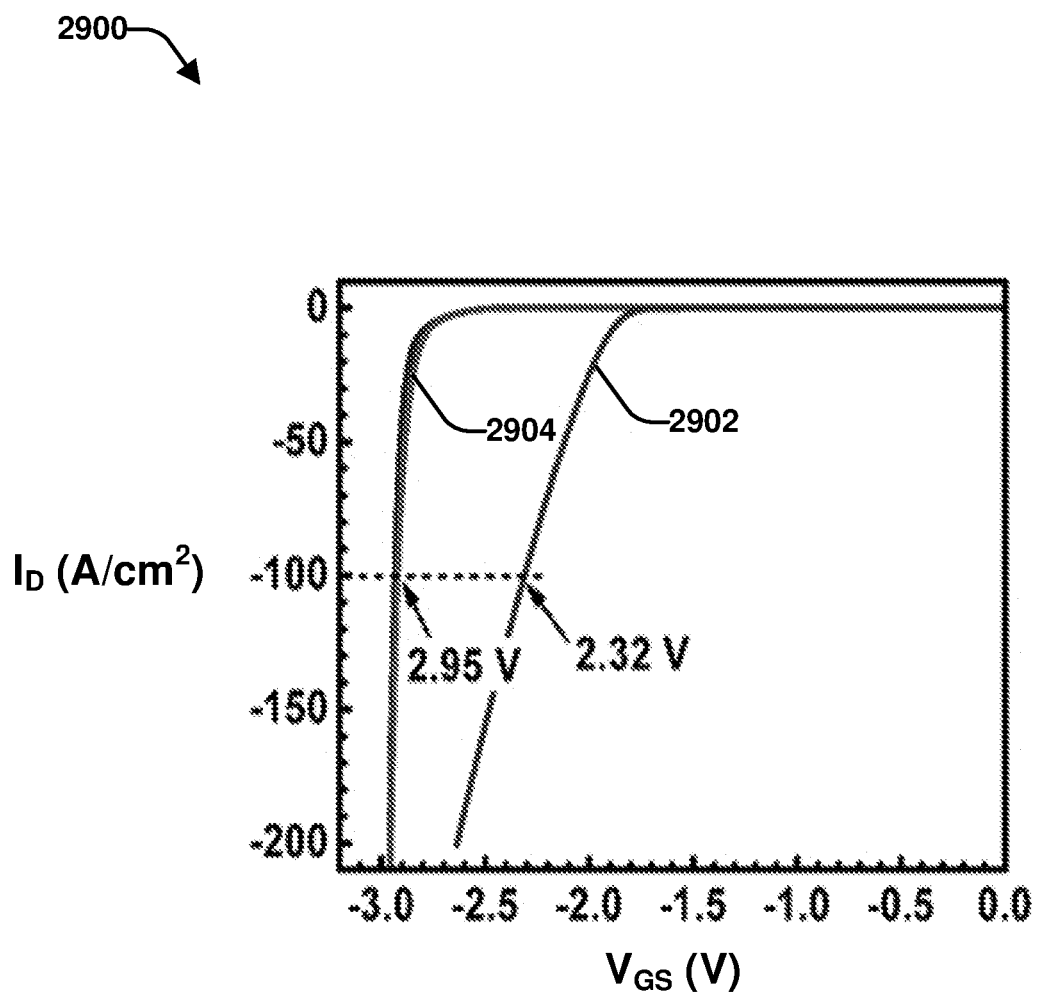
FIG. 29 present a graph illustrating reverse conducting characteristics of a semiconductor device disclosed herein and a conventional MOSFET device, in accordance with one or more embodiments described herein.

FIG. 29 provides a graph 2900 illustrating reverse conducting characteristics of the semiconductor device 100 and a conventional MOSFET device (e.g., a conventional SiC MOSFET device). An x-axis of the graph 2900 represents a gate-source voltage $V_{GS}$. A y-axis of the graph 2900 represents a drain current $I_D$. As shown in the graph 2900, a reverse conducting characteristics 2902 of the semiconductor device 100 can exhibit lower reverse conduction voltage than reverse conducting characteristics 2904 of a conventional MOSFET device. For example, reverse conduction voltage of the reverse conducting characteristics 2902 can be equal to 2.32V and reverse conduction voltage of reverse conducting characteristics 2904 can be equal to 2.95V.

Figure 30:
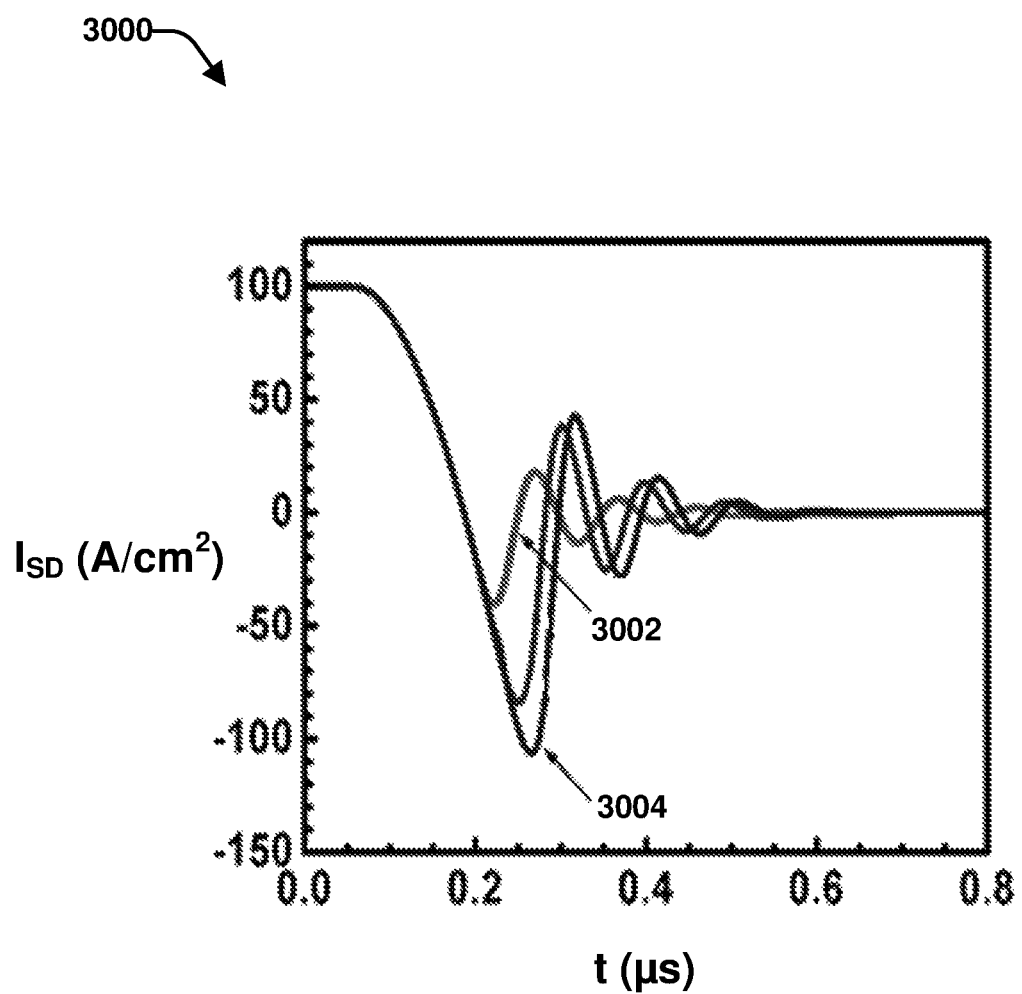
FIG. 30 present a graph illustrating reverse recovery characteristics of a semiconductor device disclosed herein and a conventional MOSFET device, in accordance with one or more embodiments described herein.

FIG. 30 provides a graph 3000 illustrating reverse recovery characteristics of the semiconductor device 100 and a conventional MOSFET device (e.g., a conventional SiC MOSFET device). An x-axis of the graph 3000 represents time t. A y-axis of the graph 3000 represents a source-drain current $I_{SD}$. As shown in the graph 3000, reverse recovery characteristics 3002 of the semiconductor device 100 can be improved as compared to reverse recovery characteristics 3004 of a conventional MOSFET device. In one example, the reverse recovery characteristics 3002 and/or the reverse recovery characteristics 3004 can be reverse recovery characteristics of a reverse diode associated with the semiconductor device 100 and/or a conventional MOSFET device.

Figure 31:
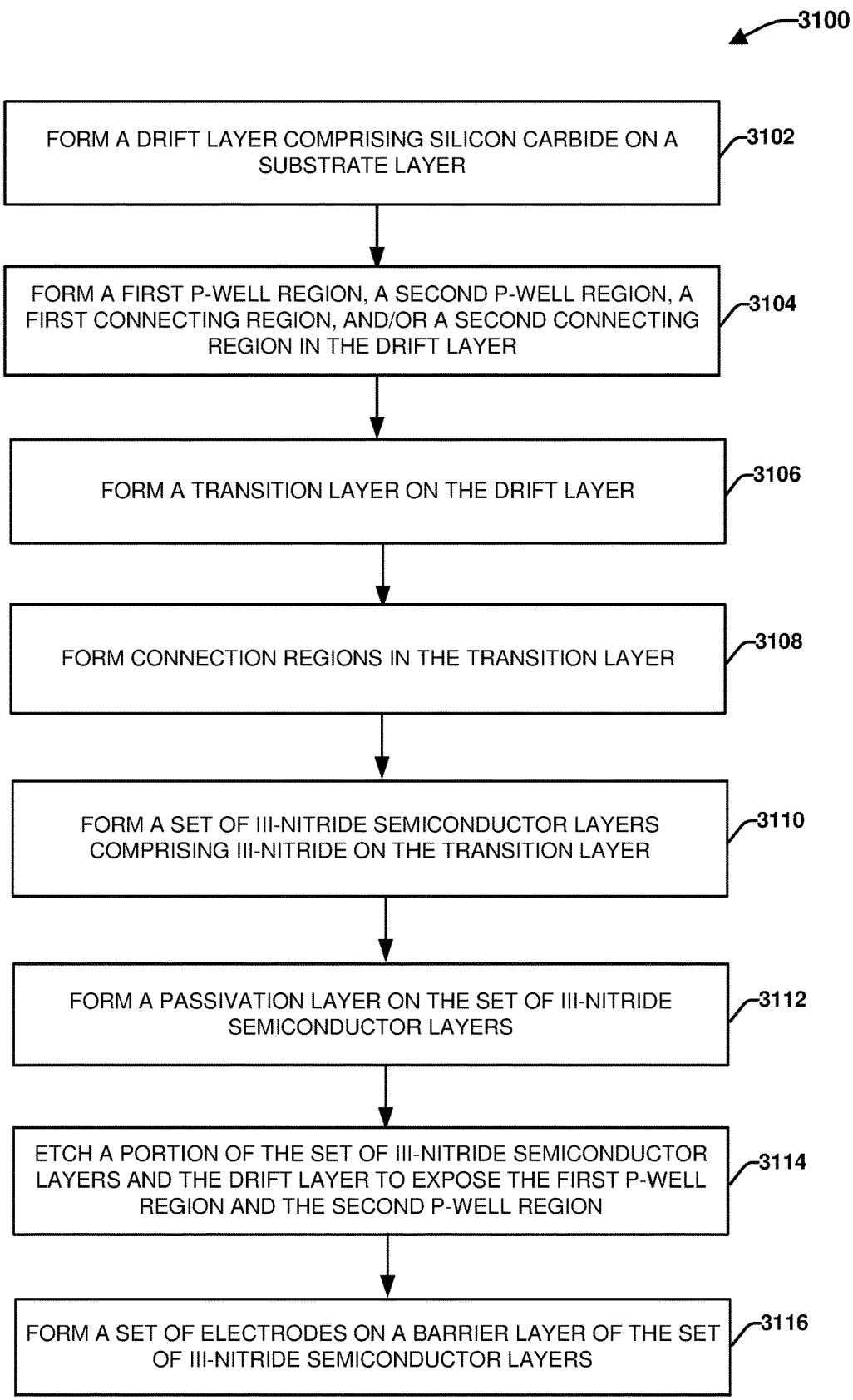
FIG. 31 presents a flow diagram of an example method for fabricating a semiconductor device disclosed herein, in accordance with one or more embodiments described herein.

FIG. 31 illustrates a method in accordance with certain aspects of this disclosure. While, for purposes of simplicity of explanation, the method is shown and described as a series of acts, it is to be understood and appreciated that this disclosure is not limited by the order of acts, as some acts may occur in different orders and/or concurrently with other acts from that shown and described herein. For example, those skilled in the art will understand and appreciate that the method can alternatively be represented as a series of interrelated states or events, such as in a state diagram. Moreover, not all illustrated acts may be required to implement the method in accordance with certain aspects of this disclosure. Additionally, it is to be further appreciated that the method disclosed hereinafter and throughout this disclosure is capable of being stored on an article of manufacture to facilitate transporting and transferring such methods to computers.

Turning now to FIG. 31, presented is a high level flow diagram of an example method 3100 for fabricating a semiconductor device (e.g., the semiconductor device 100), in accordance with aspects and embodiments described herein. At 3102, a drift layer comprising silicon carbide is formed on a substrate layer. For instance, the drift layer can be grown on the substrate layer via an epitaxy process. In one example, the substrate layer can comprise silicon carbide. Furthermore, the substrate layer can comprise a resistance that satisfies a defined criterion (e.g., the substrate layer can be a low resistivity substrate). In an aspect, the substrate layer and the drift layer can comprise a corresponding type of doping. In another aspect, the substrate layer can be formed on a drain electrode.

At 3104, a first p-well region, a second p-well region, a first connecting region, and/or a second connecting region is formed in the drift layer. For example, the first p-well region and the second p-well region can be buried p-well regions formed in the drift layer. The first p-well region and the second p-well region can allow current to flow through a region between the first p-well region and the second p-well region. In an aspect, the first p-well region and the second p-well region can be associated with a p-type semiconductor. The first connecting region and the second connecting region can be associated with an n-type semiconductor. Furthermore, the first connecting region can be a first doped connecting region and the second connecting region can be a second doped connecting region. A degree of doping for the first connecting region and the second connecting region can satisfy a defined criterion (e.g., the first connecting region and the second connecting region can be highly doped). In an embodiment, the first connecting region and the second connecting region can be formed on a surface (e.g., a top surface) of the drift layer. In another aspect, the first p-well region and the second p-well region can be formed in the drift layer via ion implantation. Alternatively, the first p-well region and the second p-well region can be formed in the drift layer by a combination of a recessing process, a growth process, a planarization process, and/or a regrowth process. Furthermore, the first connecting region and the second connecting region can be formed in the drift layer via ion implantation. Alternatively, the first connecting region and the second connecting region can be formed in the drift layer via a combination of a recessing process, a growth process, a planarization process, and/or a regrowth process.

At 3106, a transition layer is formed on the drift layer. The transition layer can be a silicon carbide layer with a doping type that corresponds to the drift layer 110.

At 3108, connecting regions are formed in the transition layer. The connecting regions can be highly doped (e.g., as compared to, for example, the drift layer) to facilitate formation of one or more ohmic contacts. For instance, the first connecting regions can be N+ semiconductor regions. The connecting regions can be formed on a surface of the transition layer for connection purposes. Furthermore, the connecting regions can be formed via an ion implantation process. Alternatively, the connecting regions can be formed via a combination of a recessing process, a growth process, a planarization process, and/or a regrowth process At 3110, a set of III-nitride semiconductor layers comprising III-nitride is formed on the transition layer. For example, the set of III-nitride semiconductor layers can be a set of gallium nitride semiconductors layers comprising gallium nitride. In an alternate embodiment, a set of aluminum nitride semiconductors comprising aluminum nitride can be formed on the drift layer, and/or a set of indium nitride semiconductors comprising indium nitride can be formed on the drift layer. In an aspect, the set of III-nitride semiconductor layers can comprise a nucleation layer, a buffer layer and/or a barrier layer. The nucleation layer can be formed on the drift layer, the buffer layer can be formed on the nucleation layer, and the barrier layer can be formed on the buffer layer. The nucleation layer can include III-nitride (e.g., gallium nitride, aluminum nitride and/or indium nitride). Furthermore, the buffer layer can include III-nitride (e.g., gallium nitride, aluminum nitride and/or indium nitride). The barrier layer can also include III-nitride (e.g., gallium nitride, aluminum nitride and/or indium nitride). In an embodiment, a first III-nitride semiconductor layer (e.g., a first gallium nitride semiconductor layer from a set of gallium nitride semiconductor layers) can be formed that comprises a different bandgap than a second III-nitride semiconductor layer (e.g., a first gallium nitride semiconductor layer from a set of gallium nitride semiconductor layers). For example, the barrier layer and the buffer layer can be associated with different bandgaps.

At 3112, a passivation layer is formed on the set of III-nitride semiconductor layers. For example, the passivation layer can be formed on the barrier layer. In a non-limiting example, the passivation layer can include silicon nitride. However, it is to be appreciated that the passivation layer can comprise a different type of material.

At 3114, a portion of the set of III-nitride semiconductor layers and the drift layer is etched to expose the first p-well region and the second p-well region. For example, a portion of the nucleation layer, the buffer layer, the barrier layer and/or the drift layer can be etched to expose the first p-well region and the second p-well region. Additionally or alternatively, another portion of the set of III-nitride semiconductor layers can be etched to expose the first connecting region and the second connecting region. For example, another portion of the nucleation layer, the buffer layer and/or the barrier layer can be etched to expose the first connecting region and the second connecting region.

At 3116, a set of electrodes is formed on a barrier layer of the set of III-nitride semiconductor layers. For example, a set of gate electrodes, a source electrode and/or a set of connection electrodes can be formed on at least the passivation layer. The set of electrodes can be a set of ohmic contacts. In an aspect, the source electrode from the set of electrodes can be electrically coupled to the first p-well region and the second p-well region. In another aspect, a set of gate electrodes from the set of electrodes can be electrically isolated from the set of III-nitride semiconductor layers. For instance, the set of gate electrodes from the set of electrodes can be a set of Schottky barrier contacts. Additionally or alternatively, the set of gate electrodes from the set of electrodes can be a set of metal-insulator-semiconductor contacts. In an embodiment, the method 3100 can further include forming, under the set of gate electrodes, a semiconductor region that is at least partially recessed. The semiconductor region can be formed via plasma etching, a combination of oxidation and wet etching, or a selective area epitaxy process. Additionally or alternatively, the method 3100 can further include forming a negative charge-trapped region located directly underneath the set of electrodes via plasma treatment or an ion implantation process (e.g., a low-energy ion implantation process), forming a p-cap region located directly underneath the set of electrodes, and/or forming a recessed region directly underneath the set of electrodes. In one example, the negative charge-trapped region can be formed by a fluorine-based plasma treatment. Additionally or alternatively, the method 3100 can further include performing thermal annealing after the forming the set of electrodes (e.g., after formation of the set of gate electrodes, the source electrode and/or the set of connection electrodes).

What has been described above includes examples of the subject invention. It is, of course, not possible to describe every conceivable combination of components or methods for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" and "involves" are used in either the detailed description or the claims, such terms are intended to be inclusive in a manner similar to the term "comprising" as "comprising" is interpreted when employed as a transitional word in a claim.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

The word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, such terms are intended to be inclusive-in a manner similar to the term "comprising" as an open transition word-without precluding any additional or other elements.

What is claimed is:

1. A semiconductor device, comprising:
a silicon carbide structure, wherein the silicon carbide structure comprises:
a drain electrode;
a substrate layer that is formed on the drain electrode and comprises silicon carbide;
a drift layer formed on the substrate layer, wherein the drift layer comprises a first p-well region and a second p-well region that allow current to flow through a region between the first p-well region and the second p-well region; and
a transition layer located above the drift layer, wherein the transition layer comprises a set of connecting regions that comprise a higher doping concentration than the drift layer and a same type of doping as the drift layer; and
a III-nitride structure, wherein the III-nitride structure comprises:

a set of III-nitride semiconductor layers that comprises III-nitride and is formed on the silicon carbide structure;
a passivation layer formed on the set of III-nitride semiconductor layers;
a source electrode electrically coupled to the first p-well region and the second p-well region;
a connection electrode electrically coupled to the set of connecting regions; and
a set of gate electrodes electrically isolated from the set of III-nitride semiconductor layers.

2. The semiconductor device of claim 1, wherein the set of III-nitride semiconductor layers comprises:
a nucleation layer that comprises III-nitride and is formed on the silicon carbide structure;
a buffer layer that comprises III-nitride and is formed on the nucleation layer; and
a barrier layer that comprises III-nitride and is formed on the buffer layer.

3. The semiconductor device of claim 1, wherein the substrate layer and the drift layer comprise a corresponding type of doping.

4. The semiconductor device of claim 1, wherein the transition layer comprises a same doping type as the drift layer.

5. The semiconductor device of claim 1, wherein a shield region is located in the transition layer, and wherein the shield region comprises a same doping type as the first p-well region and the second p-well region.

6. The semiconductor device of claim 5, wherein the shield region is electrically coupled to the source electrode.

7. The semiconductor device of claim 1, wherein the drift layer comprises silicon carbide.

8. The semiconductor device of claim 1, wherein a connecting region from the set of connecting regions is electrically coupled to a connecting electrode of the III-nitride structure.

9. The semiconductor device of claim 1, wherein a semiconductor region under the set of gate electrodes receives a negative electrical charge.

10. The semiconductor device of claim 1, wherein a semiconductor region under the set of gate electrodes is at least partially recessed.

11. The semiconductor device of claim 1, wherein a p-doped cap layer is formed between the set of gate electrodes and the barrier layer.

12. The semiconductor device of claim 1, further comprising an insertion layer that comprises aluminum gallium nitride and is formed between a first III-nitride semiconductor layer from the set of III-nitride semiconductor layers and a second III-nitride semiconductor layer from the set of III-nitride semiconductor layers.

13. The semiconductor device of claim 12, wherein the insertion layer comprises a thickness that is between 1 nanometer and 30 nanometers.

14. The semiconductor device of claim 1, wherein the set of gate electrodes comprise a set of Schottky barrier contacts or a set of metal-insulator-semiconductor contacts.

15. The semiconductor device of claim 1, wherein the set of III-nitride semiconductor layers comprises:
a nucleation layer that comprises III-nitride and is formed on the silicon carbide structure.

16. The semiconductor device of claim 15, wherein the set of III-nitride semiconductor layers comprises:
a buffer layer that comprises III-nitride and is formed on the nucleation layer.

17. The semiconductor device of claim 16, wherein the set of III-nitride semiconductor layers comprises:
a barrier layer that comprises III-nitride and is formed on the buffer layer.

18. A method, comprising:
forming a drift layer comprising silicon carbide on a substrate layer;
forming a first p-well region and a second p-well region in the drift layer;
forming a transition layer directly on the drift layer;
forming connecting regions within the transition layer that comprise a higher doping concentration than the drift layer and a same type of doping as the drift layer;
forming a set of III-nitride semiconductor layers comprising III-nitride on the transition layer;
etching a portion of the set of III-nitride semiconductor layers to expose the first p-well region and the second p-well region;
forming a passivation layer on the set of III-nitride semiconductor layers; and
forming a set of electrodes on a barrier layer of the set of III-nitride semiconductor layers.

19. The method of claim 18, wherein the forming the first p-well region and the second p-well region comprises forming the first p-well region and the second p-well region via ion implantation.

20. The method of claim 18, wherein the forming the connecting regions comprises forming the connecting regions via ion implantation.

21. The method of claim 20, further comprising etching another portion of the set of III-nitride semiconductor layers to expose the doped connecting region.

22. The method of claim 18, wherein the forming the set of III-nitride semiconductor layers comprises forming a nucleation layer comprising III-nitride on the drift layer, forming a buffer layer comprising III-nitride on the nucleation layer, and forming the barrier layer comprising III-nitride on the buffer layer.

23. The method of claim 18, wherein the forming the set of III-nitride semiconductor layers comprises forming a first III-nitride semiconductor layer that comprises a different bandgap than a second III-nitride semiconductor layer.

24. The method of claim 18, further comprising forming, under the set of electrodes, a semiconductor region that is at least partially recessed.

25. The method of claim 18, further comprising performing thermal annealing after the forming the set of electrodes.

* * * * *